United States Patent
Liu et al.

(10) Patent No.: US 12,132,160 B2
(45) Date of Patent: Oct. 29, 2024

(54) DRIVING BACKPLANE FOR DISPLAY AND METHOD OF MANUFACTURING THE SAME, DISPLAY PANEL, AND DISPLAY APPARATUS

(71) Applicant: BOE TECHNOLOGY GROUP CO., LTD., Beijing (CN)

(72) Inventors: Yingwei Liu, Beijing (CN); Zhanfeng Cao, Beijing (CN); Zhiwei Liang, Beijing (CN); Ke Wang, Beijing (CN); Muxin Di, Beijing (CN); Shuang Liang, Beijing (CN); Yankai Gao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 514 days.

(21) Appl. No.: 17/615,075

(22) PCT Filed: Nov. 4, 2020

(86) PCT No.: PCT/CN2020/126525
§ 371 (c)(1),
(2) Date: Nov. 29, 2021

(87) PCT Pub. No.: WO2021/098514
PCT Pub. Date: May 27, 2021

(65) Prior Publication Data
US 2022/0223775 A1    Jul. 14, 2022

(30) Foreign Application Priority Data
Nov. 21, 2019 (CN) .......................... 201911150726.2

(51) Int. Cl.
*H01L 33/62* (2010.01)
*G09F 9/302* (2006.01)
(Continued)

(52) U.S. Cl.
CPC ............ *H01L 33/62* (2013.01); *G09F 9/3026* (2013.01); *H01L 25/0753* (2013.01);
(Continued)

(58) Field of Classification Search
CPC ..... H01L 33/62; H01L 33/005; H01L 33/387; H01L 2933/0016; H01L 2933/0066;
(Continued)

(56) References Cited

U.S. PATENT DOCUMENTS

| 9,553,197 B2 | 1/2017 | Park et al. |
| 2003/0020847 A1 | 1/2003 | Kim et al. |

(Continued)

FOREIGN PATENT DOCUMENTS

| CN | 101034685 A | 9/2007 |
| CN | 103794617 A | 5/2014 |

(Continued)

OTHER PUBLICATIONS

Designing the Organic Light-emitting Display Driving Circuit, May 10, 2004, p. 1-64.
(Continued)

*Primary Examiner* — Wasiul Haider
(74) *Attorney, Agent, or Firm* — IP & T GROUP LLP

(57) ABSTRACT

A method of manufacturing a driving backplane for display includes: forming a first conductive pattern layer including first conductive lines on a base; and forming a second conductive pattern layer including electrode groups and second conductive lines on a side of the first conductive pattern layer away from the base. The first conductive lines and the second conductive lines cross and are insulated from each other; an electrode group includes a first electrode and a second electrode electrically connected to a corresponding second conductive line. Orthogonal projections, on the base, of the first electrode and a corresponding first conductive
(Continued)

US 12,132,160 B2

Page 2 line have an overlapping region, and a portion of the first electrode, whose orthogonal projection on the base is located in the overlapping region, is in contact with a portion of the first conductive line, whose orthogonal projection on the base is located in the overlapping region.

20 Claims, 14 Drawing Sheets

(51) Int. Cl.
 *H01L 25/075* (2006.01)
 *H01L 33/00* (2010.01)
 *H01L 33/38* (2010.01)
(52) U.S. Cl.
 CPC .......... *H01L 33/005* (2013.01); *H01L 33/387* (2013.01); *H01L 2933/0016* (2013.01); *H01L 2933/0066* (2013.01)
(58) Field of Classification Search
 CPC . H01L 27/1259; H01L 27/124; H01L 27/156; G09F 9/3026; G09F 9/33
 See application file for complete search history.

(56) References Cited

U.S. PATENT DOCUMENTS

| | | | |
|---|---|---|---|
| 2007/0212824 A1 | 9/2007 | Chen et al. | |
| 2011/0292331 A1 | 12/2011 | Chang et al. | |
| 2014/0167036 A1* | 6/2014 | Cheng | H01L 29/66969 257/43 |
| 2015/0115293 A1 | 4/2015 | Wu et al. | |
| 2017/0025444 A1 | 1/2017 | Hirakata | |
| 2017/0059908 A1 | 3/2017 | Yen et al. | |
| 2017/0154805 A1 | 6/2017 | Kim et al. | |
| 2018/0136528 A1* | 5/2018 | Xiao | G02F 1/133345 |
| 2020/0028044 A1 | 1/2020 | Lee et al. | |
| 2020/0365623 A1 | 11/2020 | Chien | |
| 2021/0050497 A1 | 2/2021 | Li et al. | |
| 2021/0210522 A1 | 7/2021 | Liu et al. | |
| 2021/0225823 A1 | 7/2021 | Liang et al. | |
| 2021/0367003 A1 | 11/2021 | Zhou et al. | |

FOREIGN PATENT DOCUMENTS

| | | |
|---|---|---|
| CN | 203882296 U | 10/2014 |
| CN | 105629614 A | 6/2016 |
| CN | 106684115 A | 5/2017 |
| CN | 106816430 A | 6/2017 |
| CN | 107634087 A | 1/2018 |
| CN | 208014703 U | 10/2018 |
| CN | 109037235 A | 12/2018 |
| CN | 109300430 A | 2/2019 |
| CN | 109326612 A | 2/2019 |
| CN | 109375405 A | 2/2019 |
| CN | 109585462 A | 4/2019 |
| CN | 109782959 A | 5/2019 |
| CN | 109786421 A | 5/2019 |
| CN | 109904186 A | 6/2019 |
| CN | 110429089 A | 11/2019 |
| CN | 110853531 A | 2/2020 |

OTHER PUBLICATIONS

The First Office Action of Priority Application No. CN 201911150726.2 issued by the Chinese Patent Office on Mar. 1, 2021.
Notification to Grant Patent Right for Invention of Priority Application No. CN 201911150726.2 issued by the Chinese Patent Office on Aug. 4, 2021.

* cited by examiner

DRIVING BACKPLANE FOR DISPLAY AND METHOD OF MANUFACTURING THE SAME, DISPLAY PANEL, AND DISPLAY APPARATUS

CROSS-REFERENCE TO RELATED APPLICATIONS

This application is a national phase entry under 35 USC 371 of International Patent Application No. PCT/CN2020/126525, filed on Nov. 4, 2020, which claims priority to Chinese Patent Application No. 201911150726.2, filed on Nov. 21, 2019, which are incorporated herein by reference in their entirety.

TECHNICAL FIELD

The present disclosure relates to the field of display technologies, and in particular, to a driving backplane for display and a method of manufacturing the same, a display panel and a display apparatus.

BACKGROUND

Mini light-emitting diodes (Mini LEDs) display apparatuses are new display apparatuses using light-emitting diodes (LEDs) with a size in a range of 100 μm to 200 μm, and micro light-emitting diodes (Micro LEDs) display apparatuses are new display apparatuses using LEDs with a size of approximately dozens of micrometers. In the Mini LED display apparatus and the Micro LED display apparatus, each LED can be individually addressed and driven to emit light, and thus the Mini LED display apparatus and the Micro LED display apparatus have advantages of high efficiency, high brightness, high reliability and high response speed. In addition, the Mini LED display apparatus and the Micro LED display apparatus do not need a backlight module, and thus have advantages of small size, light weight and small thinness, and low power consumption. Therefore, the Mini LED display apparatus and the Micro LED display apparatus are becoming hot topics of research in the current display technology field.

SUMMARY

In an aspect, a method of manufacturing a driving backplane for display is provided. The method includes: forming a first conductive pattern layer on a base, the first conductive pattern layer including a plurality of first conductive lines; and forming a second conductive pattern layer on a side of the first conductive pattern layer away from the base, the second conductive pattern layer including a plurality of electrode groups and a plurality of second conductive lines. The plurality of first conductive lines and the plurality of second conductive lines cross and are insulated from each other. An electrode group of the plurality of electrode groups includes a first electrode and a second electrode, and the second electrode is electrically connected to a corresponding second conductive line. Orthogonal projections, on the base, of the first electrode and a corresponding first conductive line have an overlapping region, and a portion of the first electrode, whose orthogonal projection on the base is located in the overlapping region, is in contact with a portion of the first conductive line, whose orthogonal projection on the base is located in the overlapping region.

In some embodiments, forming the first conductive pattern layer on the base includes: forming a first seed film on the base; patterning the first seed film to obtain a seed pattern layer including a plurality of first conductive sub-lines; forming a first insulating layer on the base on which the seed pattern layer has been formed, the first insulating layer including a plurality of first hollow-out portions, an orthogonal projection, on the base, of each first hollow-out portion being located within an orthogonal projection, on the base, of a corresponding first conductive sub-line; and forming a first electroplated metal layer on a surface of the seed pattern layer away from the base and in the plurality of first hollow-out portions. The first electroplated metal layer including a plurality of second conductive sub-lines, and a second conductive sub-line and a first conductive sub-line in contact therewith constitute the first conductive line.

In some embodiments, forming the first insulating layer on the base on which the seed pattern layer has been formed includes: forming a first insulating sub-film on the base on which the seed pattern layer has been formed, a material of the first insulating sub-film including an inorganic material; forming a second insulating sub-film on a surface of the first insulating sub-film away from the base, a material of the second insulating sub-film including an organic material; and patterning the second insulating sub-film and the first insulating sub-film to obtain the first insulating layer.

In some embodiments, forming the second conductive pattern layer on the side of the first conductive pattern layer away from the base includes: forming a second seed film on the base on which the first electroplated metal layer has been formed; forming a second insulating layer on a surface of the second seed film away from the base, the second insulating layer including a plurality of second hollow-out portions, a plurality of third hollow-out portions and a plurality of fourth hollow-out portions, the plurality of second hollow-out portions being located in regions where a plurality of first electrodes are to be formed, the plurality of third hollow-out portions being located in regions where a plurality of second electrodes are to be formed, the plurality of fourth hollow-out portions being located in regions where the plurality of second conductive lines are to be formed; forming a second electroplated metal layer on the surface of the second seed film away from the base and in the plurality of the second hollow-out portions, the plurality of third hollow-out portions and the plurality of fourth hollow-out portions; and removing the second insulating layer and portions of the second seed film that overlap with the second insulating layer, so that the second electroplated metal layer and remaining portions of the second seed film form the plurality of first electrodes in regions where portions of the second electroplated metal layer formed in the plurality of second hollow-out portions are located, the plurality of second electrodes in regions where portions of the second electroplated metal layer formed in the plurality of third hollow-out portions are located, and the plurality of second conductive lines in regions where portions of the second electroplated metal layer formed in the plurality of fourth hollow-out portions are located.

In some embodiments, before the second seed film is formed, the method further includes forming a first planarization layer on the base on which the first electroplated metal layer has been formed. The first planarization layer includes a plurality of fifth hollow-out portions, and an orthogonal projection, on the base, of each fifth hollow-out portion overlaps with an orthogonal projection, on the base, of a second hollow-out portion.

In some embodiments, forming the second seed film on the base on which the first electroplated metal layer has been formed includes: forming the second seed film on the base on which the first planarization layer has been formed.

In some embodiments, the method further includes: forming a second planarization layer, a passivation layer and a third planarization layer sequentially on the base on which the second conductive pattern layer has been formed; forming a metal film on a side of the base away from the third planarization layer; patterning the metal film to form a plurality of first bonding electrodes and a plurality of second bonding electrodes; forming a plurality of first connection lines and a plurality of second connection lines on side faces of the base, each first connection line extending to positions of a corresponding first conductive line and a corresponding first bonding electrode from a side face of the base and being electrically connected to the first conductive line and the first bonding electrode, each second connection line extending to positions of a corresponding second conductive line and a corresponding second bonding electrode from a side face of the base and being electrically connected to the second conductive line and the second bonding electrode; and patterning at least the passivation layer and the third planarization layer to expose the first electrode and the second electrode.

In some embodiments, the second conductive pattern layer further includes a plurality of connection electrodes. An edge portion of the first conductive line in a length direction thereof is electrically connected to a connection electrode, and the first connection line extends from a side face of the first conductive line to a side face of the connection electrode that is electrically connected to the first conductive line.

In some embodiments, the method further includes: forming a protective layer at least on the side faces of the base on which the plurality of first connection lines and the plurality of second connection lines have been formed. The protective layer covers the plurality of first connection lines and the plurality of second connection lines.

In some embodiments, forming the plurality of first connection lines and the plurality of second connection lines on the side faces of the base includes: forming the plurality of first connection lines and the plurality of second connection lines on the side faces of the base through any one of a pad printing, a three-dimension (3D) printing, a patterning process or a laser cutting.

In some embodiments, the driving backplane for display has a plurality of sub-pixel regions, and at least one electrode group is disposed in a sub-pixel region. The plurality of first conductive lines extend in a row direction of the plurality of sub-pixel regions, and the plurality of second conductive lines extend in a column direction of the plurality of sub-pixel regions. All first electrodes in a row of sub-pixel regions are electrically connected to at least two first conductive lines, and different first conductive lines are electrically connected to different first electrodes. All second electrodes in a column of sub-pixel regions are electrically connected to at least one second conductive line.

In some embodiments, at least one sub-pixel region is provided with two electrode groups, and the two electrode groups are a first electrode group and a second electrode group.

In some embodiments, a first electrode in the first electrode group and a first electrode in the second electrode group are electrically connected to a same first conductive line. A second electrode in the first electrode group and a second electrode in the second electrode group are electrically connected to a same second conductive line.

In some embodiments, a first electrode in the first electrode group and a first electrode in the second electrode group are electrically connected to a same first conductive line. A second electrode in the first electrode group and a second electrode in the second electrode group are electrically connected to two different second conductive lines.

In some embodiments, a first electrode in the first electrode group and a first electrode in the second electrode group are electrically connected to two different first conductive lines. A second electrode in the first electrode group and a second electrode in the second electrode group are electrically connected to a same second conductive line.

In some embodiments, a width of the first conductive line in a direction perpendicular to a direction in which the first conductive line extends is greater than a width of the second conductive line in a direction perpendicular to a direction in which the second conductive line extends.

In another aspect, a driving backplane for display is provided. The driving backplane for display is manufactured through the method of manufacturing the driving backplane for display as described above. The driving backplane for display includes: the base; the first conductive pattern layer disposed on the base, the first conductive pattern layer including the plurality of first conductive lines; and the second conductive pattern layer disposed on the side of the first conductive pattern layer away from the base. The second conductive pattern layer includes the plurality of electrode groups and the plurality of second conductive lines. The plurality of first conductive lines and the plurality of second conductive lines cross and are insulated from each other. The electrode group of the plurality of electrode groups includes the first electrode and the second electrode, and the second electrode is electrically connected to the corresponding second conductive line. The orthogonal projections, on the base, of the first electrode and the corresponding first conductive line have the overlapping region, and the portion of the first electrode, whose orthogonal projection on the base is located in the overlapping region, is in contact with the portion of the first conductive line, whose orthogonal projection on the base is located in the overlapping region.

In yet another aspect, a display panel is provided. The display panel includes the driving backplane for display and a plurality of light-emitting devices. The driving backplane for display has a plurality of sub-pixel regions, and the plurality of light-emitting devices are disposed in the plurality of sub-pixel regions. One light-emitting device in each sub-pixel region is configured to emit light. Each light-emitting device that is configured to emit light is electrically connected to the first electrode and the second electrode in a same electrode group disposed in the sub-pixel region.

In some embodiments, a positive electrode and a negative electrode of the light-emitting device that is configured to emit light are electrically connected to the first electrode and the second electrode in the electrode group.

In yet another aspect, a display apparatus is provided. The display apparatus includes a display screen, and the display screen is tiled by a plurality of display panels as described above.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art can obtain other drawings according to these drawings. In addition, the accompanying drawings to be described below may be regarded as schematic diagrams, but are not limitations on actual sizes of products, actual processes of methods and actual timings of signals involved in the embodiments of the present disclosure.

DETAILED DESCRIPTION

Figure 1:
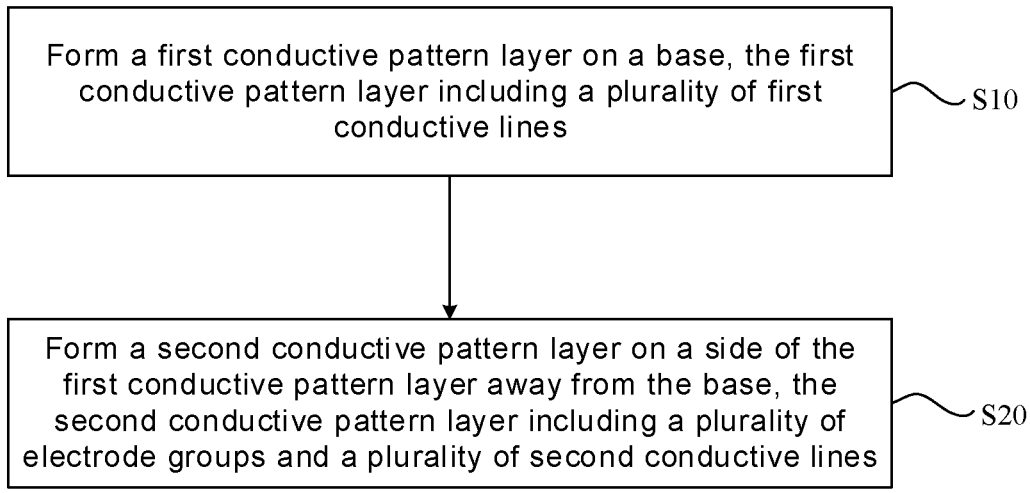
FIG. 1 is a flow diagram showing a method of manufacturing a driving backplane for display, in accordance with some embodiments.

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, the term "comprise" and other forms thereof such as the third-person singular form "comprises" and the present participle form "comprising" throughout the description and the claims are construed as an open and inclusive meaning, i.e., "including, but not limited to". In the description, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

Hereinafter, the terms "first" and "second" are used for descriptive purposes only, and are not to be construed as indicating or implying the relative importance or implicitly indicating the number of indicated technical features. Thus, a feature defined with "first" or "second" may explicitly or implicitly include one or more of the features. In the description of the embodiments of the present disclosure, the term "a plurality of"/the plurality of means two or more unless otherwise specified.

In the description of some embodiments, the term "connected" and its derivatives may be used. For example, the term "connected" may be used in the description of some embodiments to indicate that two or more components are in direct or indirect contact with each other. The embodiments disclosed herein are not necessarily limited to the contents herein.

The use of "configured to" herein indicates an open and inclusive meaning, which does not exclude devices that are applicable to or configured to perform additional tasks or steps.

Exemplary embodiments are described herein with reference to sectional views and/or plan views as idealized exemplary drawings. In the accompanying drawings, thicknesses of layers and sizes of regions are enlarged for clarity. Therefore, the exemplary embodiments should not be construed to be limited to shapes of regions shown herein, but to include deviations in the shapes due to, for example, manufacturing. In addition, the regions shown in the accompanying drawings are schematic in nature, and their shapes are not intended to show actual shapes of the regions in a device, and are not intended to limit the scope of the exemplary embodiments.

As shown in FIG. 1, some embodiments of the present disclosure provide a method of manufacturing a driving backplane 1 for display, and the method includes steps 10 and 20 (S10 and S20).

Figure 2:
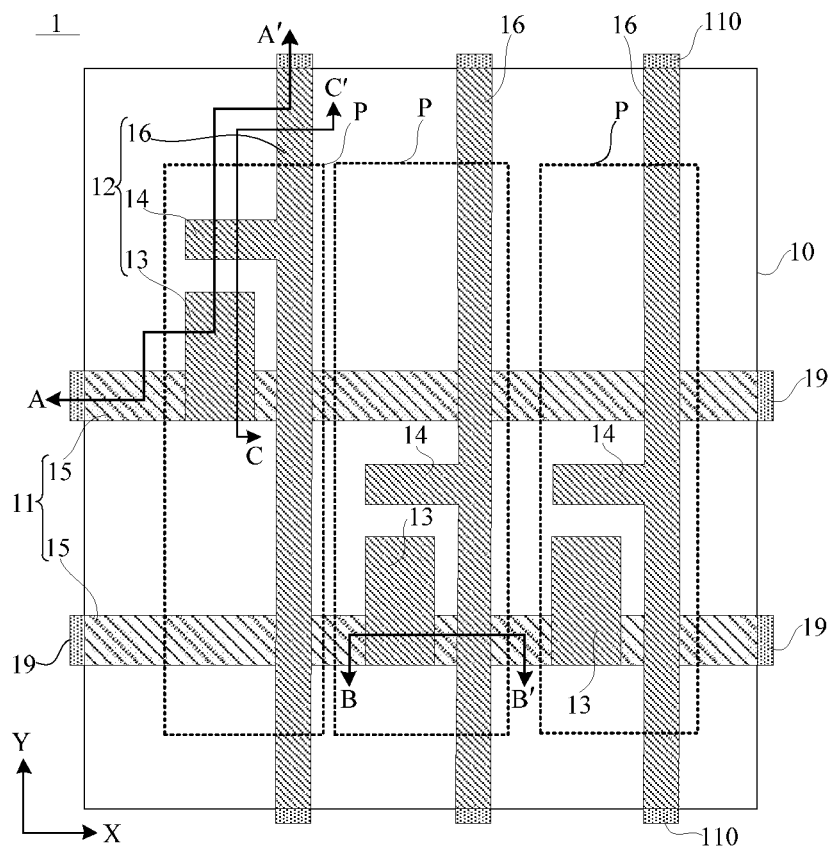
FIG. 2 is a top view showing a structure of a driving backplane for display, in accordance with some embodiments.
Figure 3A:
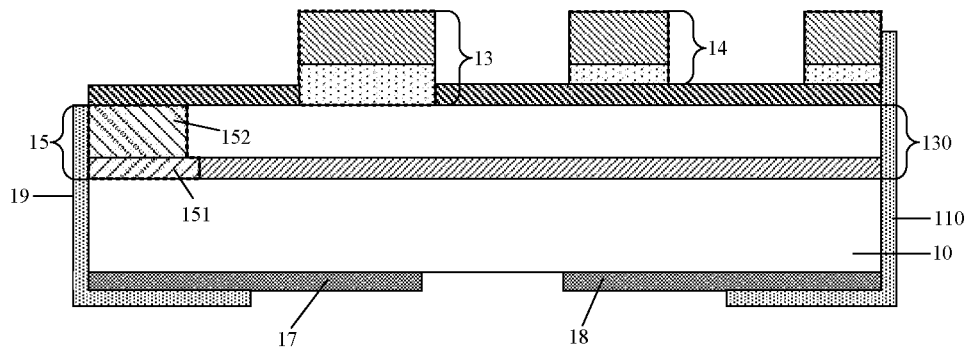
FIG. 3A is a sectional view showing a structure of the driving backplane for display in FIG. 2 taken along the direction A-A'.
Figure 3B:
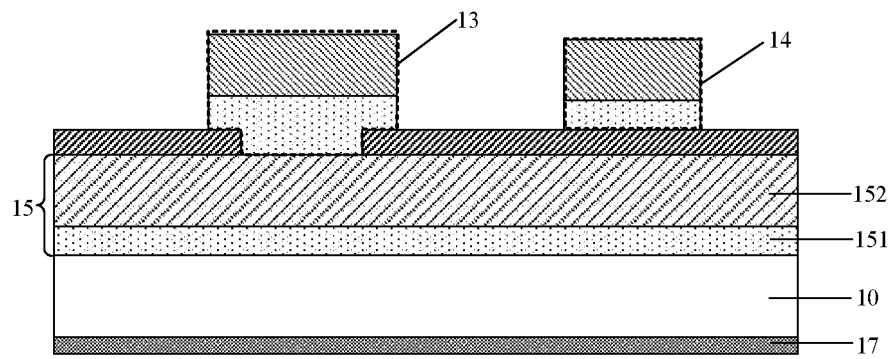
FIG. 3B is a sectional view showing a structure of the driving backplane for display in FIG. 2 taken along the direction B-B'.
Figure 3C:
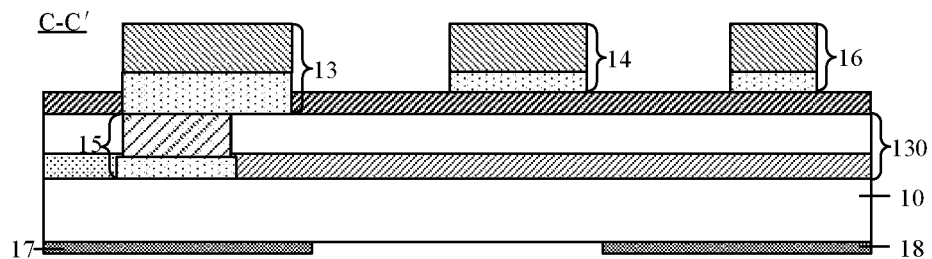
FIG. 3C is a sectional view showing a structure of the driving backplane for display in FIG. 2 taken along the direction C-C'.

In S10, as shown in FIGS. 2 to 3C, a first conductive pattern layer 11 is formed on a base 10, and the first conductive pattern layer 11 includes a plurality of first conductive lines 15.

A material of the base 10 is not limited in the embodiments of the present disclosure. For example, the base 10 is a glass base or a silicon base.

In S20, as shown in FIGS. 2 to 3C, a second conductive pattern layer 12 is formed on a side of the first conductive pattern layer 11 away from the base 10, and the second conductive pattern layer 12 includes a plurality of electrode groups and a plurality of second conductive lines 16. The plurality of first conductive lines 15 and the plurality of second conductive lines 16 cross and are insulated from each other.

An electrode group of the plurality of electrode groups includes a first electrode 13 and a second electrode 14. The second electrode 14 is electrically connected to a corresponding second conductive line 16. Orthogonal projections, on the base 10, of the first electrode 13 and a corresponding first conductive line 15 have an overlapping region, and a portion of the first electrode 13, whose orthogonal projection on the base 10 is located in the overlapping region, is in contact with a portion of the first conductive line 15, whose orthogonal projection on the base 10 is located in the overlapping region. For example, each of the plurality of electrode groups includes a first electrode 13 and a second electrode 14, and the second electrode 14 in each electrode group is electrically connected to a corresponding second conductive line 16. Orthogonal projections, on the base 10, of the first electrode 13 in the electrode group and a corresponding first conductive line 15 have an overlapping region, and a portion of the first electrode 13, whose orthogonal projection on the base 10 is located in the overlapping region, is in contact with a portion of the first conductive line 15, whose orthogonal projection on the base 10 is located in the overlapping region.

Any second conductive line 16 may be electrically connected to the second electrode 14 in one electrode group, or may be electrically connected to each second electrode 14 in part of the plurality of electrode groups. Similarly, any first conductive line 15 may be electrically connected to the first electrode 13 in one electrode group, or may be electrically connected to each first electrode 13 in part of the plurality of electrode groups. In addition, the first electrode 13 and the second electrode 14 in the electrode group are insulated from each other.

In the embodiments of the present disclosure, the expression "the second conductive pattern layer 12 including the plurality of electrode groups and the plurality of second conductive lines 16" means that all first electrodes 13 and all second electrodes 14 in the plurality of electrode groups, and the plurality of second conductive lines 16 are arranged in the same layer. All first electrodes 13 and all second electrodes 14 in the plurality of electrode groups, and the plurality of second conductive lines 16 are formed synchronously in the manufacturing process, so that each second conductive line 16 and the second electrode 14 electrically connected thereto are connected to form a one-piece structure.

For example, the first electrode 13 in the electrode group is configured to be electrically connected to a positive electrode of a light-emitting device, and the second electrode 14 in the electrode group is configured to be electrically connected to a negative electrode of the light-emitting device. In this way, the first electrode 13 and the second electrode 14 respectively receive signals from the first conductive line 15 and the second conductive line 16, so as to drive the light-emitting device to emit light. For another example, the first electrode 13 in the electrode group is configured to be electrically connected to a negative electrode of a light-emitting device, and the second electrode 14 in the electrode group is configured to be electrically connected to a positive electrode of the light-emitting device. In this way, the first electrode 13 and the second electrode 14 respectively receive signals from the first conductive line 15 and the second conductive line 16, so as to drive the light-emitting device to emit light.

In the method of manufacturing the driving backplane 1 for display provided in the embodiments of the present disclosure, the plurality of first conductive lines 15 are formed first, and then the plurality of electrode groups and the plurality of second conductive lines 16 that are arranged in the same layer are formed on a side of the plurality of first conductive lines 15 away from the base 10. In this way, the first electrodes 13 and the second electrodes 14 of the electrode groups are located in the same layer, and thus it is convenient for positive electrodes and negative electrodes of light-emitting devices to be bonded to the first electrodes 13 and the second electrodes 14, thereby reducing a bonding difficulty of the light-emitting devices, and improving a bonding yield of the light-emitting devices.

Figure 4:
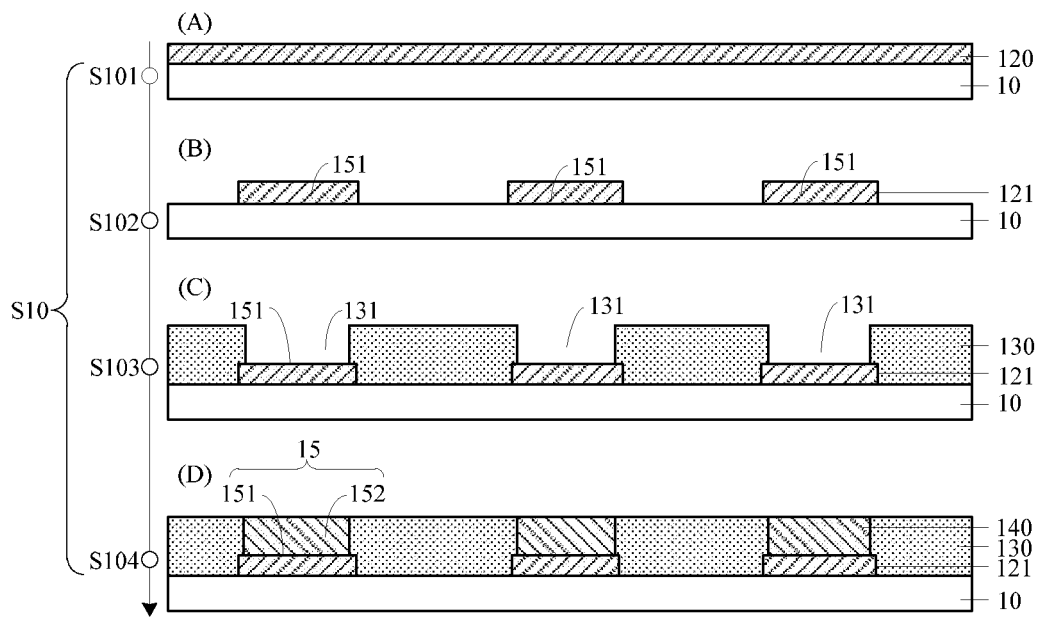
FIG. 4 is a manufacturing process diagram of a first conductive pattern layer, in accordance with some embodiments.

In some embodiments, as shown in FIG. 4, S10 includes steps 101 to 104 (S101 to S104).

In S101, as shown in part (A) in FIG. 4, a first seed film 120 is formed on the base 10.

In some examples, the first seed film 120 is formed through a magnetron sputtering process. In some examples, a material of the first seed film 120 includes metal, such as copper (Cu) or silver (Ag).

In S102, as shown in part (B) in FIG. 4, the first seed film 120 is patterned to obtain a seed pattern layer 121 including a plurality of first conductive sub-lines 151.

In some examples, a thickness of the seed pattern layer 121 is in a range of 3000 Å to 5000 Å.

The first seed film 120 may be patterned through a patterning process. Here, the patterning process includes an exposure process, a development process, an etching process and a stripping process. That is, photoresist is coated on a surface of the first seed film 120 away from the base 10 first; then, the photoresist is exposed and developed to obtain a photoresist remaining portion, and the photoresist remaining portion is located in a region where the seed pattern layer 121 is to be formed; subsequently, a portion of the first seed film 120 that is not covered by the photoresist remaining portion is removed through the etching process, so that a remaining part of the first seed film 120 forms the seed pattern layer 121 including the plurality of first conductive sub-lines 151; and at last, the photoresist remaining portion is stripped off.

In S103, as shown in part (C) in FIG. 4, a first insulating layer 130 is formed on the base 10 on which the seed pattern layer 121 has been formed. The first insulating layer 130 includes a plurality of first hollow-out portions 131, and an orthogonal projection, on the base 10, of each first hollow-out portion 131 is located within an orthogonal projection, on the base 10, of a corresponding first conductive sub-line 151.

In some examples, the orthogonal projection, on the base 10, of each first hollow-out portion 131 completely overlaps with the orthogonal projection, on the base 10, of the corresponding first conductive sub-line 151. In some other examples, an edge, which extends in a width direction of the first conductive sub-line 151, of the orthogonal projection of each first hollow-out portion 131 on the base 10 is flush with an edge, which extends in the width direction of the first conductive sub-line 151, of the orthogonal projection of the corresponding first conductive sub-line 151 on the base 10. An edge, which extends in a length direction of the first conductive sub-line 151, of the orthogonal projection of the first conductive sub-line 151 corresponding to each first hollow-out portion 131 on the base 10 exceeds an edge, which extends in the length direction of the first conductive sub-line 151, of the orthogonal projection of the first hollow-out portion 131 on the base 10. The length direction of the first conductive sub-line 151 is a direction in which the first conductive sub-line 151 extends.

The first hollow-out portion 131 penetrates through the first insulating layer 130, so that a portion, located below the hollow-out portion 131, of a surface of the first conductive sub-line 151 away from the base 10 is exposed and is not covered by the first insulating layer 130.

The first insulating layer 130 may be of a single-layer structure, or may be of a multi-layer stacked structure, which is not limited in the embodiments of the present disclosure.

In some examples, as shown in part (C) in FIG. 4, the first insulating layer 130 is of the single-layer structure. In this case, for example, the first insulating layer 130 is made of photosensitive polyimide (PI) or a resin material. In some other examples, the first insulating layer 130 is of the multi-layer stacked structure, and based on this, as shown in FIG. 5, S103 includes steps 1031 to 1033 (S1031 to S1033).

Figure 5:
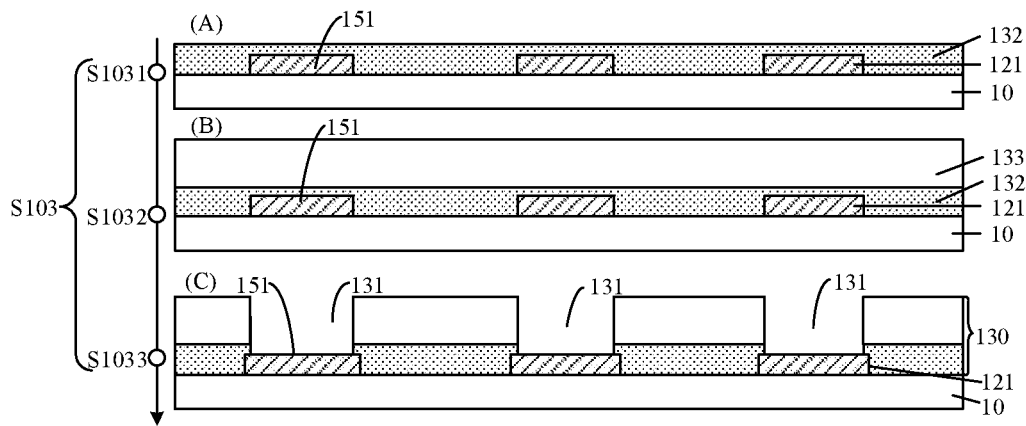
FIG. 5 is another manufacturing process diagram of a first conductive pattern layer, in accordance with some embodiments.

In S1031, as shown in part (A) in FIG. 5, a first insulating sub-film 132 is formed on the base 10 on which the seed pattern layer 121 has been formed. A material of the first insulating sub-film 132 includes an inorganic material. For example, the inorganic material is silicon nitride (SiN).

The first insulating sub-film 132 covers the formed first conductive sub-lines 151.

In S1032, as shown in part (B) in FIG. 5, a second insulating sub-film 133 is formed on a surface of the first insulating sub-film 132 away from the base 10. A material of the second insulating sub-film 133 includes an organic material. For example, the organic material is one of PI and a resin material. In a process of forming the second insulating sub-film 133, the first insulating sub-film 132 protects the first conductive sub-lines 151. For example, when the second insulating sub-film 133 needs to be dried during the formation process, the first insulating sub-film 132 prevents oxygen and nitrogen in the drying environment from directly contacting with the first conductive sub-lines 151, so as to prevent the first conductive sub-lines 151 from being oxidized or nitrided, thereby ensuring the performance of the first conductive sub-lines 151.

In S1033, as shown in part (C) in FIG. 5, the second insulating sub-film 133 and the first insulating sub-film 132 are patterned to obtain the first insulating layer 130.

A portion of the second insulating sub-film 133 and a portion of the first insulating sub-film 132 that are located in a region where each first hollow-out portion 131 is to be formed are sequentially etched through the patterning process, so that the plurality of first hollow-out portions 131 are formed.

That is to say, the first insulating layer 130 includes a first insulating sub-layer and a second insulating sub-layer that are sequentially stacked in a thickness direction of the base 10, the first insulating sub-layer includes the inorganic material, and the second insulating sub-layer includes the organic material. The first insulating sub-layer and the second insulating sub-layer are obtained by patterning the first insulating sub-film 132 and the second insulating sub-film 133, respectively. Based on this, the first hollow-out portions 131 are located in the first insulating sub-layer and the second insulating sub-layer, and penetrate through the first insulating sub-layer and the second insulating sub-layer.

In S104, as shown in part (D) in FIG. 4, a first electroplated metal layer 140 is formed on a surface of the seed pattern layer 121 away from the base 10 and in the first hollow-out portions 131. That is, the first electroplated metal layer 140 is formed only in the regions where the seed pattern layer 121 is exposed by the first insulating layer 130. The first electroplated metal layer 140 includes a plurality of second conductive sub-lines 152, and each second conductive sub-line 152 and a first conductive sub-line 151 in contact therewith constitute the first conductive line 15.

The number of the second conductive sub-lines 152, the number of the first conductive sub-lines 151 and the number of the first hollow-out portions 131 are equal, and directions in which the first conductive sub-line 151, the first hollow-out portion 131 and the second conductive sub-line 152 extend are the same. That is, one first conductive line 15 composed of the first conductive sub-line 151 and the second conductive sub-line 152 that are in contact with each other is formed in a region where each hollow-out portion 131 is located.

It will be noted that, FIG. 4 illustrates a formation process of three first conductive lines 15, but the number of the first conductive lines 15 is not limited to three in the embodiments of the present disclosure.

The first electroplated metal layer 140 is formed through an electroplating process. In the electroplating process, the seed pattern layer 121 is used as a electroplating electrode to be connected to an external power supply, so that a metal material may grow on the seed pattern layer 121 to form the first electroplated metal layer 140. The first electroplated metal layer 140 with a large thickness may be fabricated through the electroplating process, so that an overall thickness of the first conductive line 15 composed of the second conductive sub-line 152 and the first conductive sub-line 151 may be increased; as a result, a resistance of the first conductive line 15 may be reduced, which is conducive to reducing a voltage drop and a power consumption.

In some examples, the thickness of the first electroplated metal layer 140 is in a range of 5 μm to 20 μm.

In some examples, the seed pattern layer 121 and the first electroplated metal layer 140 are made of the same material such as one of Cu or Ag. Of course, the seed pattern layer 121 and the first electroplated metal layer 140 may be made of different materials.

It will be noted that, in a case where the first conductive sub-line 151 and the second conductive sub-line 152 are made of the same material (e.g., Cu), there is no contact interface between the first conductive sub-line 151 and the second conductive sub-line 152 in a sectional view of the first conductive line 15. In a case where the first conductive sub-line 151 and the second conductive sub-line 152 are made of different materials (e.g., one of the first conductive sub-line 151 and the second conductive sub-line 152 is made of Cu, and the other is made of Ag), there may be a contact interface between the first conductive sub-line 151 and the second conductive sub-line 152 in the sectional view (e.g., FIGS. 3A, 3B, 3C and 4) of the first conductive line 15.

FIGS. 3A, 3B, 3C and 4 only clearly illustrate positions and structures of the first conductive sub-line 151 and the second conductive sub-line 152, and do not represent the materials of the first conductive sub-line 151 and the second conductive sub-line 152. Whether the first conductive sub-line 151 and the second conductive sub-line 152 are made of the same material is not limited in the embodiments of the present disclosure.

Figure 6:
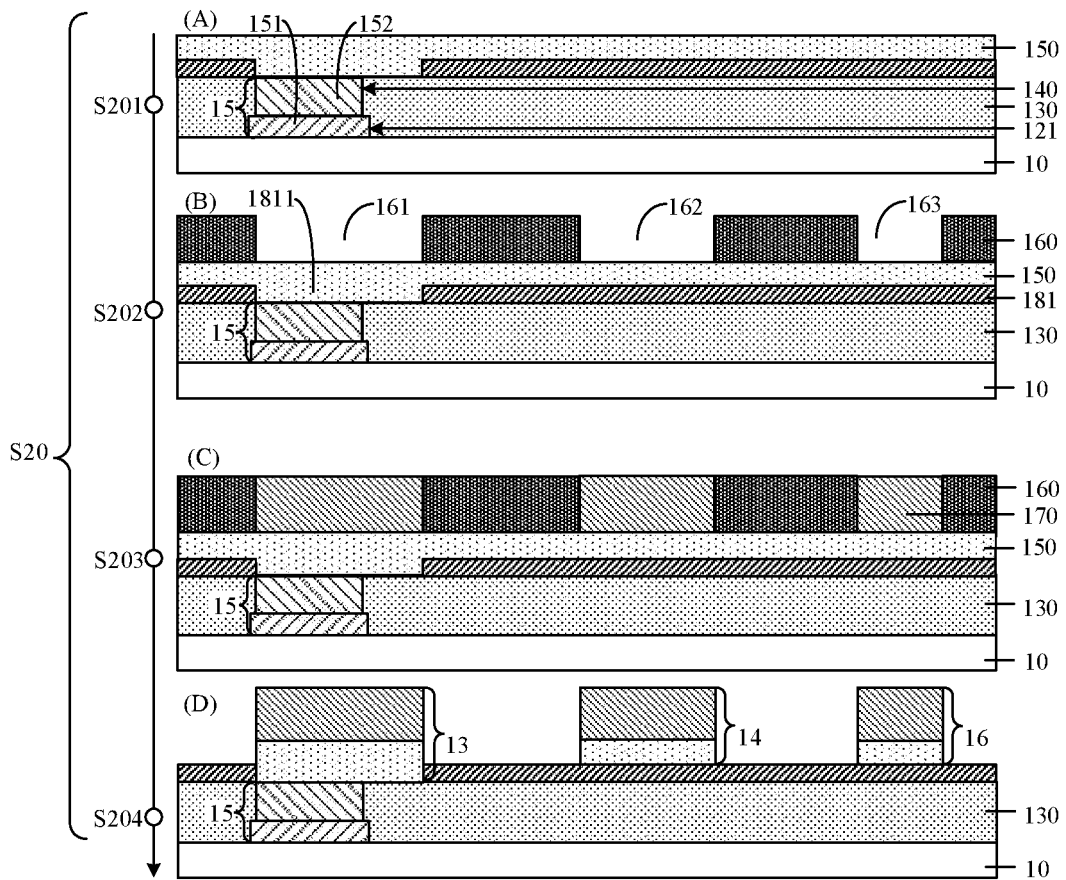
FIG. 6 is a manufacturing process diagram of a second conductive pattern layer, in accordance with some embodiments.

In some embodiments, as shown in FIG. 6, S20 includes steps 201 to 204 (S201 to S204). It will be noted that, for convenience of description, FIG. 6 is a schematic diagram showing a process of forming a portion of the structure in FIG. 3C.

In S201, as shown in part (A) in FIG. 6, a second seed film 150 is formed on the base 10 on which the first electroplated metal layer 140 has been formed.

In order to achieve electrical connection between the first conductive lines 15 and the first electrodes 13 to be formed, the second seed film 150 is in contact with portions of the first conductive lines 15 in regions where the first conductive lines 15 and the first electrodes 13 to be formed are in contact.

In some examples, the second seed film 150 is formed through a magnetron sputtering process.

In some examples, a material of the second seed film 150 includes metal, such as Cu or Ag.

In S202, as shown in part (B) in FIG. 6, a second insulating layer 160 is formed on a surface of the second seed film 150 away from the base 10. The second insulating layer 160 includes a plurality of second hollow-out portions 161, a plurality of third hollow-out portions 162 and a plurality of fourth hollow-out portions 163. The plurality of second hollow-out portions 161 are located in regions where the first electrodes 13 are to be formed, the plurality of third hollow-out portions 162 are located in regions where the second electrodes 14 are to be formed, and the plurality of fourth hollow-out portions 163 are located in regions where the plurality of second conductive lines 16 are to be formed.

The number of the second hollow-out portions 161 is the same as the number of the first electrodes 13, and each second hollow-out portion 161 is located in a region where one first electrode 13 is to be formed, so that the first electrode 13 is formed in the second hollow-out portion 161. The number of the third hollow-out portions 162 is the same as the number of the second electrodes 14, and each third hollow-out portion 162 is located in a region where one second electrode 14 is to be formed, so that the second electrode 14 is formed in the third hollow-out portion 162. The number of the fourth hollow-out portions 163 is the same as the number of the second conductive lines 16, and each fourth hollow-out 163 is located in a region where one second conductive line 16 is to be formed, so that the second conductive line 16 is formed in the fourth hollow-out portion 163.

The second hollow-out portions 161, the third hollow-out portions 162 and the fourth hollow-out portions 163 all penetrate through the second insulating layer 160.

In some examples, the second insulating layer 160 is made of an organic photosensitive material. For example, the second insulating layer 160 is made of a photoresist. In a process of forming the second insulating layer 160, through a photolithography process, the second hollow-out portions 161, the third hollow-out portions 162 and the fourth hollow-out portions 163 are respectively formed in the regions where the first electrodes 13 are to be formed, the regions where the second electrodes 14 are to be formed and the regions where the second conductive lines 16 are to be formed. The photolithography process includes an exposure process and a development process. For example, a photoresist layer is formed on the second seed film 150 by coating, and then the photoresist layer is patterned through the exposure process and the development process, so as to form the second insulating layer 160 including the second hollow-out portions 161, the third hollow-out portions 162 and the fourth hollow-out portions 163.

In S203, as shown in part (C) in FIG. 6, a second electroplated metal layer 170 is formed on a surface of the second seed film 150 away from the base 10 and in the second hollow-out portions 161, the third hollow-out portions 162 and the fourth hollow-out portions 163.

After the second electroplated metal layer 170 is formed, the second electroplated metal layer 170 is only located in the regions where the second seed film 150 is exposed by the second insulating layer 160, and a portion of the second electroplated metal layer 170 that is located in the second hollow-out portion 161 is in direct contact with the second conductive sub-line 152 of the first conductive line 15.

The second electroplated metal layer 170 is formed through an electroplating process. The second electroplated metal layer 170 with a large thickness may be fabricated through the electroplating process, so that the first electrode 13, the second electrode 14 and the second conductive line 16 that are subsequently formed have a large thickness.

In S204, as shown in part (D) in FIG. 6, the second insulating layer 160 and portions of the second seed film 150 that overlap with the second insulating layer 160 are removed, so that the second electroplated metal layer 170 and remaining portions of the second seed film 150 (which constitute a second seed layer) form the first electrodes 13 in regions where portions of the second electroplated metal layer 170 formed in the second hollow-out portions 161 are located, the second electrodes 14 in regions where portions of the second electroplated metal layer 170 formed in the third hollow-out portions 162 are located, and the second conductive lines 16 in regions where portions of the second electroplated metal layer 170 formed in the fourth hollow-out portions 163 are located.

That is, the second insulating layer 160 and portions, whose orthogonal projections on the base 10 overlap with an orthogonal projection of the second insulating layer 160 on the base 10, of the second seed film 150 are removed, so that the second electroplated metal layer 170 and the remaining portions of the second seed film 150 form one first electrode 13 in the region where the portion of the second electroplated metal layer 170 formed in each second hollow-out portion 161 is located, form one second electrode 14 in the region where the portion of the second electroplated metal layer 170 formed in each third hollow-out portion 162 is located, and form one second conductive line 16 in the region where the portion of the second electroplated metal layer 170 formed in each fourth hollow-out portion 163 is located.

Correspondingly, the first electrode 13, the second electrode 14 and the second conductive line 16 are each of a double-layer structure. In the double-layer structure of the first electrode 13, a layer away from the base 10 is the portion of the second electroplated metal layer 170 formed in the second hollow-out portion 161, and another layer proximate to the base 10 is a remaining portion of the second seed film 150 that overlaps with the portion of the second electroplated metal layer 170 formed in the second hollow-out portion 161. In a double-layer structure of the second electrode 14, a layer away from the base 10 is the portion of the second electroplated metal layer 170 formed in the third hollow-out portion 162, and another layer proximate to the base 10 is a remaining portion of the second seed film 150 that overlaps with the portion of the second electroplated metal layer 170 formed in the third hollow-out portion 162; in a double-layer structure of the second conductive line 16, a layer away from the base 10 is the portion of the second electroplated metal layer 170 formed in the fourth hollow-out portion 163, and a layer proximate to the base 10 is a remaining portion of the second seed film 150 that overlaps with the portion of the second electroplated metal layer 170 formed in the fourth hollow-out portion 163.

In some examples, the second insulating layer 160 may be removed through an etching process. In some examples, the portions of the second seed film 150 that overlap with the second insulating layer 160 may be removed through any one of an etching process or a laser cutting.

In some examples, the portions of the second seed film 150 that overlap with the second insulating layer 160 are removed through a wet etching process. The wet etching process refers to etching the second seed film 150 through an etching solution. In a case where the second seed film 150 is made of Cu, the etching solution may be, for example, hydrogen peroxide.

In the processes of S201 to S204, after the second insulating layer 160 is removed, the second electroplated metal layer 170 may be used as a mask to etch the second seed film 150, so that the portions of the second seed film 150 that overlap with the second insulating layer 160 are removed to form the second seed layer. Therefore, there is no need to use an additional mask in the process of forming the second seed layer, which reduces the production cost.

It will be noted that, although it is possible to cause a portion of the second electroplated metal layer 170 to be etched in a process of using the second electroplated metal layer 170 as a mask to etch the second seed film 150, since a thickness of the second electroplated metal layer 170 is much greater than a thickness of the second seed film 150, a thickness of this portion that is lost can be negligible.

In a case where the second seed layer is formed synchronously through a patterning process when the second seed film 150 is formed, and then the second insulating layer 160 and the second electroplated metal layer 170 are sequentially formed, an additional mask is needed in a process of patterning the second seed film 150. However, in the method of manufacturing the driving backplane 1 for display provided in some embodiments of the present disclosure, there is no need to use an additional mask in the process of patterning the second seed film 150 to form the second seed layer; as a result, the etching manner is simple and the etching efficiency is high, which is conducive to reducing the production cost.

In some embodiments, after the first electroplated metal layer 140 is formed and before the second seed film 150 is formed, the method further includes step 11 (S11).

Figure 7:
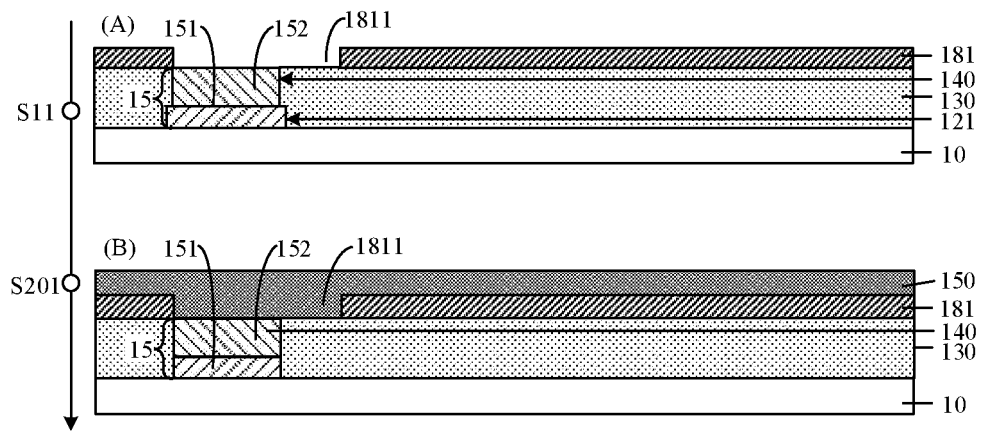
FIG. 7 is a manufacturing process diagram of a first planarization layer and a second seed film, in accordance with some embodiments.

In S11, as shown in part (A) in FIG. 7 and part (B) in FIG. 6, a first planarization layer 181 is formed. The first planarization layer 181 includes a plurality of fifth hollow-out portions 1811. As shown in part (B) in FIG. 6, an orthogonal projection of each fifth hollow-out portion 1811 on the base 10 overlaps with an orthogonal projection of one second hollow-out portion 161 to be formed on the base 10.

Based on this, in some examples, as shown in part (B) in FIG. 7, S201 includes forming the second seed film 150 on the base 10 on which the first planarization layer 181 has been formed. The second seed film 150 covers a surface of the first planarization layer 181 away from the base 10, and fills the plurality of fifth hollow-out portions 1811, so that the second seed film 150 is in contact with the second conductive sub-lines 152 of the first electroplated metal layer 140.

The description that the orthogonal projection of each fifth hollow-out portion 1811 on the base 10 overlaps with the orthogonal projection of one second hollow-out portion 161 to be formed on the base 10 may be understood as that, each fifth hollow-out portion 1811 is located in a region where the one second hollow-out portion 161 to be formed is located. An area of the orthogonal projection of the fifth hollow-out portion 1811 on the base 10 may be less than an area of the orthogonal projection of the second hollow-out portion 161 to be formed on the base 10, or the area of the orthogonal projection of the fifth hollow-out portion 1811 on the base 10 may be equal to the area of the orthogonal projection of the second hollow-out portion 161 to be formed on the base 10.

The fifth hollow-out portion 1811 penetrates through the first planarization layer 181, so as to expose a portion of the second conductive sub-line 152 used for contacting with the first electrode 13 to be formed. That is, the fifth hollow-out portion 1811 is used for electrically connecting the first electrode 13 to be formed to the first conductive line 15.

In this way, the first planarization layer 181 may ensure that the first conductive line 15 is insulated from the second conductive line 16. In addition, the first planarization layer 181 may planarize the base 10 on which the first electroplated metal layer 140 has been formed, which is conducive to subsequently forming the second seed film 150 on the base 10, and may avoid an adverse effect on the fabrication of the second seed film 150 due to an uneven surface on which the second seed film 150 is formed.

In some embodiments, the method further includes steps 301 to 304 (S301 to S304).

Figure 8A:
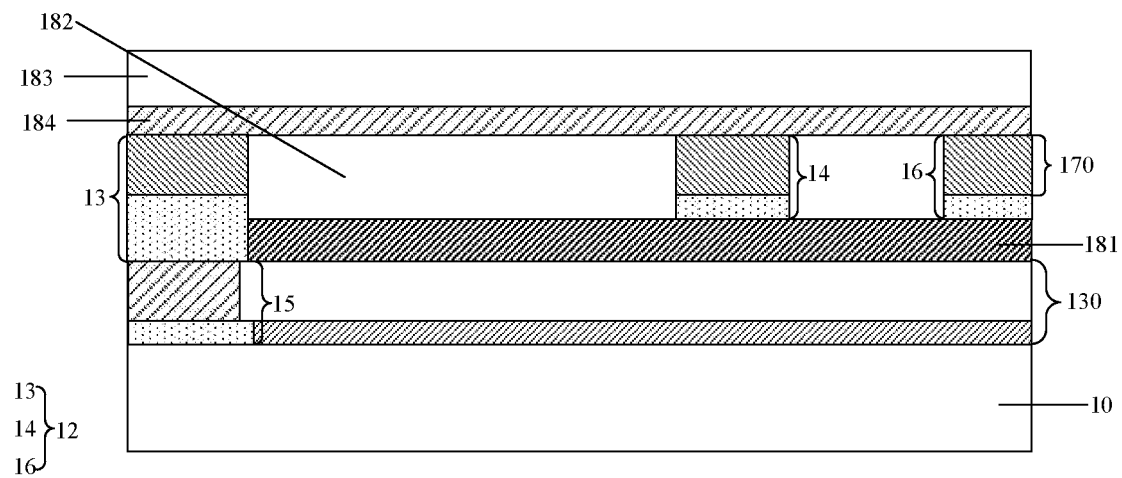
FIG. 8A is a manufacturing process diagram of a second planarization layer, a passivation layer and a third planarization layer, in accordance with some embodiments.

In S301, as shown in FIG. 8A, a second planarization layer 182, a passivation layer 184, and a third planarization layer 183 are sequentially formed on the base 10 on which the second conductive pattern layer 12 has been formed.

That is, the passivation layer 184 is located on a side of the second planarization layer 182 away from the base 10, and the third planarization layer 183 is located on a side of the passivation layer 184 away from the second planarization layer 182. For example, the second planarization layer 182 and the third planarization layer 183 are made of photosensitive PI or an acrylic material.

The second planarization layer 182 is configured to planarize the base 10 on which the second conductive pattern layer 12 has been formed, so as to facilitate subsequent fabrication of the passivation layer 184 and the third planarization layer 183.

For example, the passivation layer 184 is made of SiN. The passivation layer 184 is configured to prevent oxygen and nitrogen from affecting the second conductive pattern layer 12 during the formation of the third planarization layer 183.

Figure 8B:
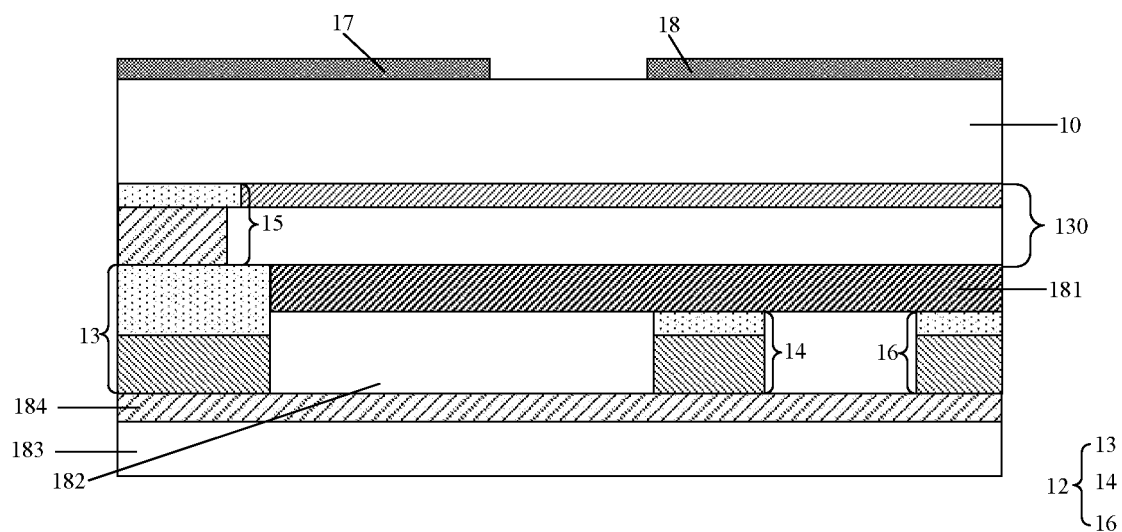
FIG. 8B is a manufacturing process diagram of a first bonding electrode and a second bonding electrode, in accordance with some embodiments.

In S302, as shown in FIG. 8B, a metal film is formed on a side of the base 10 away from the third planarization layer 183, and the metal film is patterned to form a plurality of first bonding electrodes 17 and a plurality of second bonding electrodes 18.

For example, the first bonding electrodes 17 and the second bonding electrodes 18 are made of a conductive metal such as Cu or Ag. In some examples, the first bonding electrodes 17 and the second bonding electrodes 18 are made of the same material as the first conductive lines 15 and the second conductive lines 16.

The base 10 may be turned over when the metal film is formed, so that a surface of the base 10 away from the third planarization layer 183 faces upwards, which is as shown in FIG. 8B.

Figure 8C:
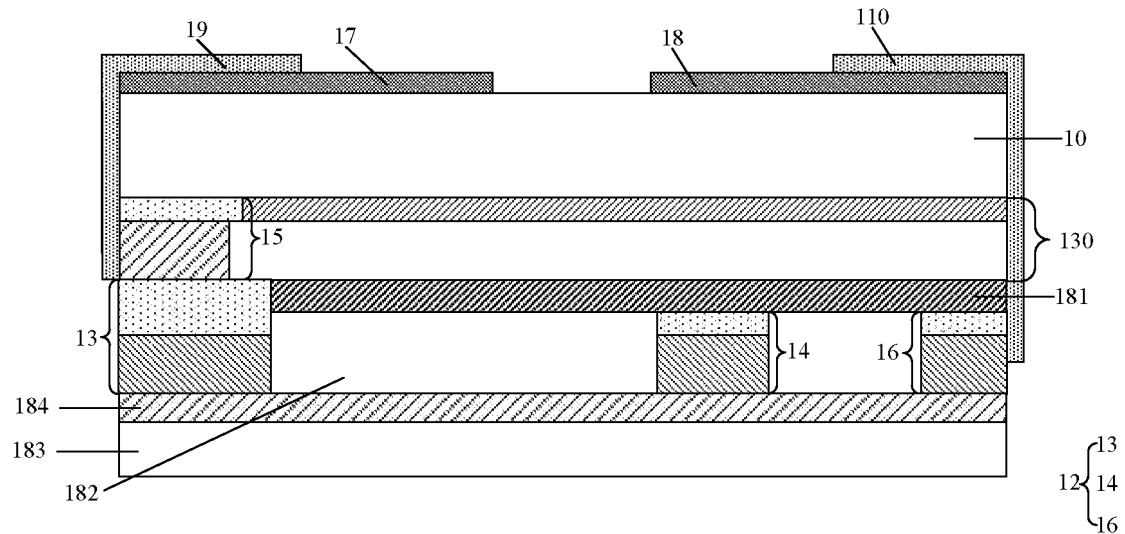
FIG. 8C is a manufacturing process diagram of a first connection line and a second connection line, in accordance with some embodiments.

In S303, as shown in FIG. 8C, a plurality of first connection lines 19 and a plurality of second connection lines 110 are formed on side faces of the base 10. Each first connection line 19 extends to positions of a corresponding first conductive line 15 and a corresponding first bonding electrode 17 from a side face of the base 10, and is electrically connected to the first conductive line 15 and the first bonding electrode 17; and each second connection line 110 extends to positions of a corresponding second conductive line 16 and a corresponding second bonding electrode 18 from a side face of the base 10, and is electrically connected to the second conductive line 16 and the second bonding electrode 18. For example, the first connection line 19 and the second connection line 110 extend to surfaces of the first bonding electrode 17 and the second bonding electrode 18 away from the base 10, respectively.

Therefore, the first connection line 19 is electrically connected to a side face of the first conductive line 15, and the second connection line 110 is electrically connected to a side face of the second conductive line 16.

In some examples, the plurality of first connection lines 19 are arranged in parallel, and the plurality of second connection lines 110 are arranged in parallel.

The plurality of first connection lines 19 may be formed on one or more side faces of the base 10, as long as any two first connection lines 19 are insulated from each other. Similarly, the plurality of second connection lines 110 may be formed on one or to more side faces of the base 10, as long as any two second connection lines 110 are insulated from each other.

For example, the plurality of first connection lines 19 are formed on two opposite side faces of the base 10, and the plurality of second connection lines 110 are formed on another two opposite side faces of the base 10. For example, the two opposite side faces are parallel to a width direction of the base 10, and the another two opposite side faces are parallel to a length direction of the base 10.

In some examples, referring to FIG. 2, the plurality of first connection lines 19 are divided into a plurality of first connection line groups, each first connection line group includes two first connection lines 19, and the two first connection lines 19 are disposed on the two opposite side faces of the base 10. Two ends of each first conductive line 15 are electrically connected to the two first connection lines 19 in the first connection line group. The plurality of second connection lines 110 are divided into a plurality of second connection line groups, each second connection line group includes two second connection lines 110, and the two second connection lines 110 are disposed on the another two opposite side faces. Two ends of each second conductive line 16 are connected to the two second connection lines 110 in the second connection line group. In this way, each first conductive line 15 and each second conductive line 16 adopt a manner of power supply from two ends, so that electrical signals are transmitted to the first conductive line 15 from the two ends of the first conductive line 15 and the second conductive line 16 from the two ends of the second conductive line 16, which is conducive to ensuring the uniformity of the electrical signal transmission and reduce the voltage drop.

In a case where the first bonding electrode 17 and the second bonding electrode 18 are connected to external power supplies, the first bonding electrode 17 transmits an electrical signal to the first conductive line 15 through the first connection line 19, and the second bonding electrode 18 transmits an electrical signal to the second conductive line 16 through the second connection line 110.

Figure 8D:
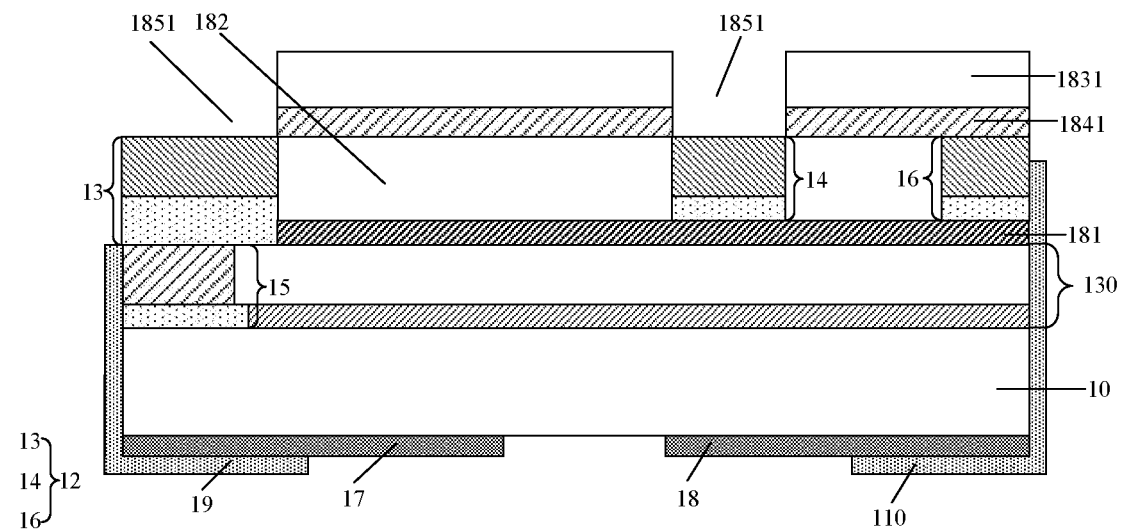
FIG. 8D is a diagram showing a structure obtained after the passivation layer and the third planarization layer are patterned, in accordance with some embodiments.

In S304, as shown in FIG. 8D, at least the passivation layer 184 and the third planarization layer 183 are patterned to obtain a passivation pattern layer 1841 and a third planarization pattern layer 1831 and expose the first electrodes 13 and the second electrodes 14.

In a case where the second planarization layer 182 does not cover the second conductive pattern layer 12, for example, an upper surface of the second planarization layer 182 (i.e., a surface of the second planarization layer 182 away from the base 10) is flush with an upper surface of the second conductive pattern layer 12 (i.e., a surface of the second conductive pattern layer 12 away from the base 10), as shown in FIG. 8D, only the passivation layer 184 and the third planarization layer 183 are patterned to form a plurality of sixth hollow-out portions 1851 that penetrate through the passivation layer 184 and the third planarization layer 183. The plurality of sixth hollow-out portions 1851 expose the first electrodes 13 and the second electrodes 14 for subsequently bonding light-emitting devices to the first electrodes 13 and the second electrodes 14.

Figure 8E:
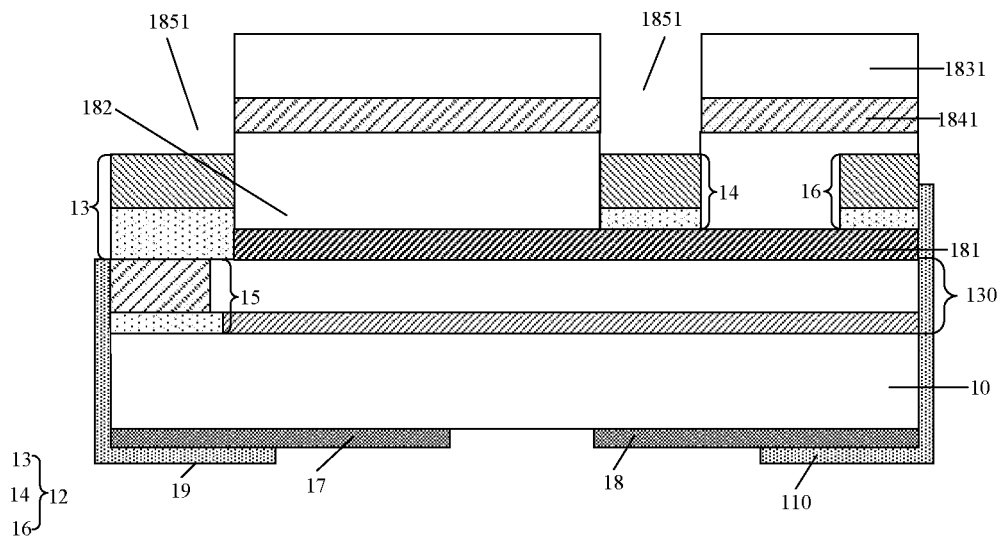
FIG. 8E is a diagram showing another structure obtained after the second planarization layer, the passivation layer and the third planarization layer are patterned, in accordance with some embodiments.

In a case where the second planarization layer 182 covers the second conductive pattern layer 12, as shown in FIG. 8E, the second planarization layer 182, the passivation layer 184, and the third planarization layer 183 are patterned to form a plurality of sixth hollow-out portions 1851 that penetrate through the second planarization layer 182, the passivation layer 184 and the third planarization layer 183. The plurality of sixth hollow-out portions 1851 expose the first electrodes 13 and the second electrodes 14 for subsequently bonding light-emitting devices to the first electrodes 13 and the second electrodes 14.

In the process of manufacturing the driving backplane 1 for display, the second planarization layer 182, the passivation layer 184 and the third planarization layer 183 are fabricated first, and then the first bonding electrodes 17 and the second bonding electrodes 18 are fabricated, and after that, the second planarization layer 182, the passivation layer 184 and the third planarization layer 183 are patterned; in this way, it may prevent oxygen or nitrogen from affecting the first electrodes 13 and the second electrodes 14 in the process of fabricating the first bonding electrodes 17 and the second bonding electrodes 18, thereby ensuring qualities of the first electrodes 13 and the second electrodes 14. In addition, since the first bonding electrodes 17 and the second bonding electrodes 18, and the first conductive lines 15 and the second conductive lines 16 are located on two sides of the base 10 in the embodiments of the present disclosure, in a case where a size of the base 10 is certain, a size of a display region of a display panel adopting the driving backplane 1 for display may be large, and a display area of the display panel is large. Therefore, a screen-to-body ratio is increased, and it is conducive to achieving a narrow bezel of the display panel.

In some examples, forming the plurality of first connection lines 19 and the plurality of second connection lines 110 on the side faces of the base 10 includes: forming the plurality of first connection lines 19 and the plurality of second connection lines 110 on the side faces of the base 10 through any one of pad printing, three-dimension (3D) printing (also referred to as additive manufacturing), patterning process or laser cutting.

For example, the plurality of first connection lines 19 and the plurality of second connection lines 110 are formed by pad printing with a conductive silver adhesive. For example, a conductive silver layer is coated on a substrate first; then the conductive silver layer is cut to obtain a plurality of conductive silver strips; and after that, the plurality of conductive silver strips are adhered to the side faces of the base 10 through an adhesive. The plurality of conductive silver strips are the plurality of first connection lines 19 and the plurality of second connection lines 110.

For another example, the plurality of first connection lines 19 and the plurality of second connection lines 110 are formed by printing powder-like metal layer by layer on the side faces of the base 10 through the 3D printing.

For yet another example, the plurality of first connection lines 19 and the plurality of second connection lines 110 are formed through the patterning process. For example, a metal film is formed on the side faces of the base 10 through a magnetron sputtering process, and then the metal film is etched to form the plurality of first connection lines 19 and the plurality of second connection lines 110.

For yet another example, the plurality of first connection lines 19 and the plurality of second connection lines 110 are formed through the laser cutting process. For example, a metal film is formed on the side faces of the base 10 first, and then the metal film is cut through laser, so that the plurality of first connection lines 19 and the plurality of second connection lines 110 are formed.

For example, a material of the first connection lines 19 and the second connection lines 110 is Cu or Ag.

The manners of fabricating the first connection lines 19 and the second connection lines 110 are simple and various; therefore, a suitable manner may be selected according to actual needs, which has high flexibility.

Figure 9A:
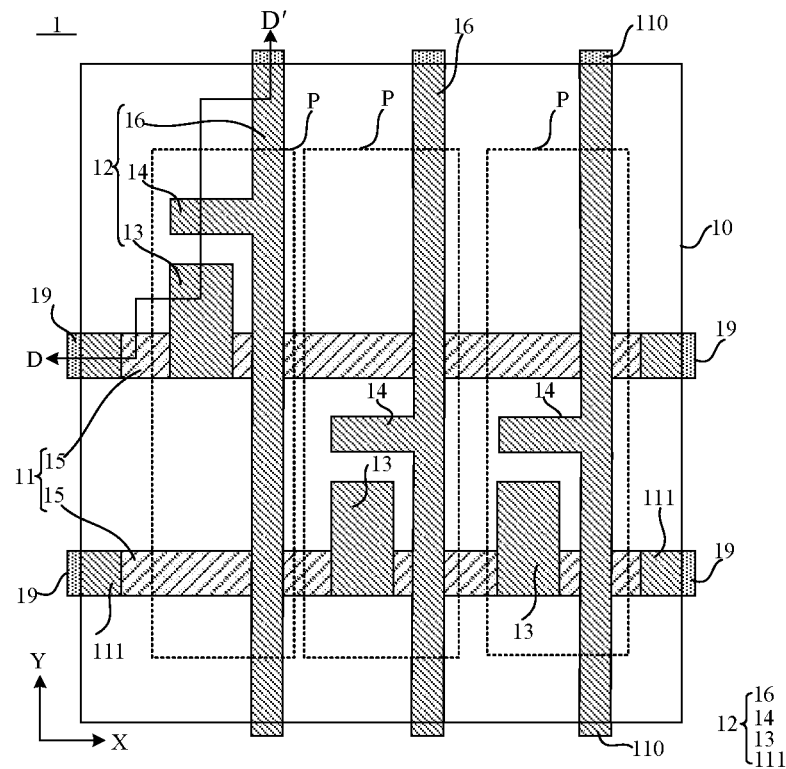
FIG. 9A is a top view showing a structure of another driving backplane for display, in accordance with some embodiments.
Figure 9B:
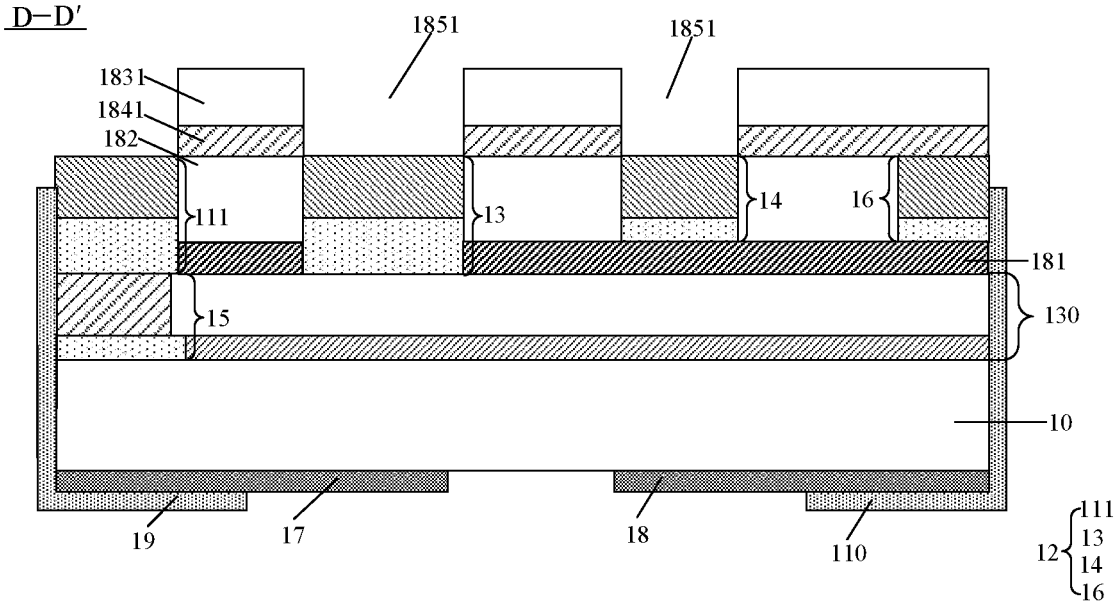
FIG. 9B is a sectional view showing a structure of the driving backplane for display in FIG. 9A taken along the direction D-D'.

As shown in FIGS. 9A and 9B, in some embodiments, the second conductive pattern layer 12 further includes a plurality of connection electrodes 111. An edge portion of the first conductive line 15 in a length direction thereof is electrically connected to a connection electrode 111, and the first connection line 19 extends from the side face of the first conductive line 15 to a side face of the connection electrode 111 that is electrically connected to the first conductive line 15.

In a case where the two ends of the first conductive line 15 are electrically connected to the two first connection lines 19 in the first connection line group, each edge portion of the first conductive line 15 in the length direction thereof is electrically connected to one connection electrode 111, and each first connection line 19 in the first connection line group extends from the side face of the first conductive line 15 to the side face of the connection electrode 111 that is electrically connected to the first conductive line 15. The length direction of the first conductive line 15 is a direction in which the first conductive line 15 extends. For example, in the thickness direction of the base 10, an orthogonal projection, on the base 10, of the connection electrode 111, is located within an orthogonal projection, on the base 10, of a corresponding first conductive line 15.

Based on this, an electrical signal may be transmitted from the first bonding electrode 17 to the first conductive line 15 through the first connection line 19 and the connection electrode 111 in sequence. Since the connection electrode 111 and the second conductive line 16 are located in the same layer, heights, in the thickness direction of the base 10, of portions of the first connection line 19 and the second connection line 110 extending in the thickness direction of the base 10 are the same, which is conducive to fabricating the first connection line 19 and the second connection line 110 on the side faces of the base 10.

Figure 10A:
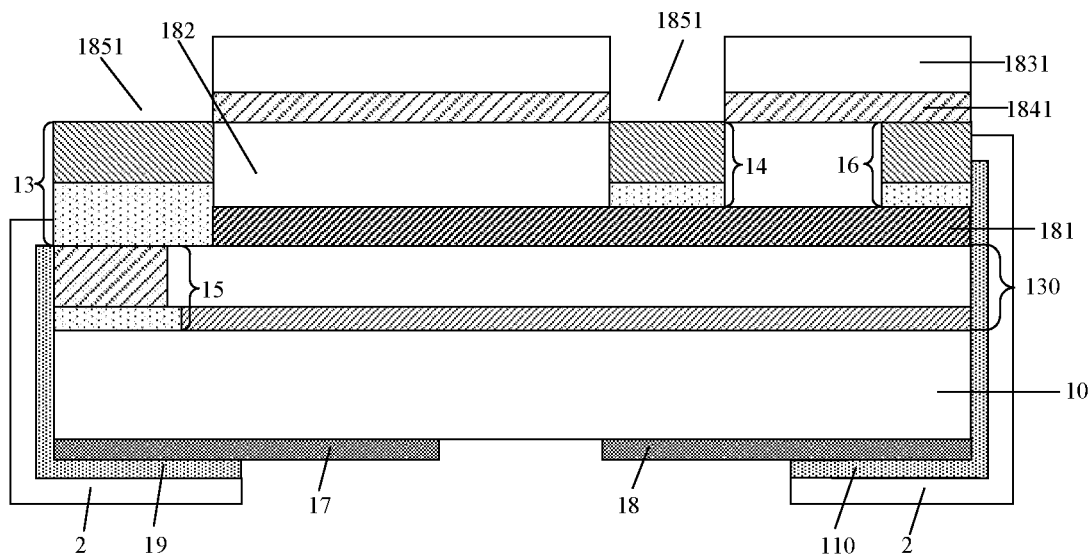
FIG. 10A is a sectional view showing a structure of yet another driving backplane for display, in accordance with some embodiments.

In some examples, as shown in FIG. 10A, the method of manufacturing the driving backplane 1 for display further includes: forming a protective layer 2 at least on the side faces of the base 10 on which the plurality of first connection lines 19 and the plurality of second connection lines 110 have been formed, and the protective layer 2 covers the plurality of first connection lines 19 and the plurality of second connection lines 110.

The protective layer 2 may prevent the first connection lines 19 and the second connection lines 110 from being scratched, thereby reducing a defect rate of the driving backplane 1 for display during the manufacturing process. For example, the protective layer 2 is made of a resin.

Figure 10B:
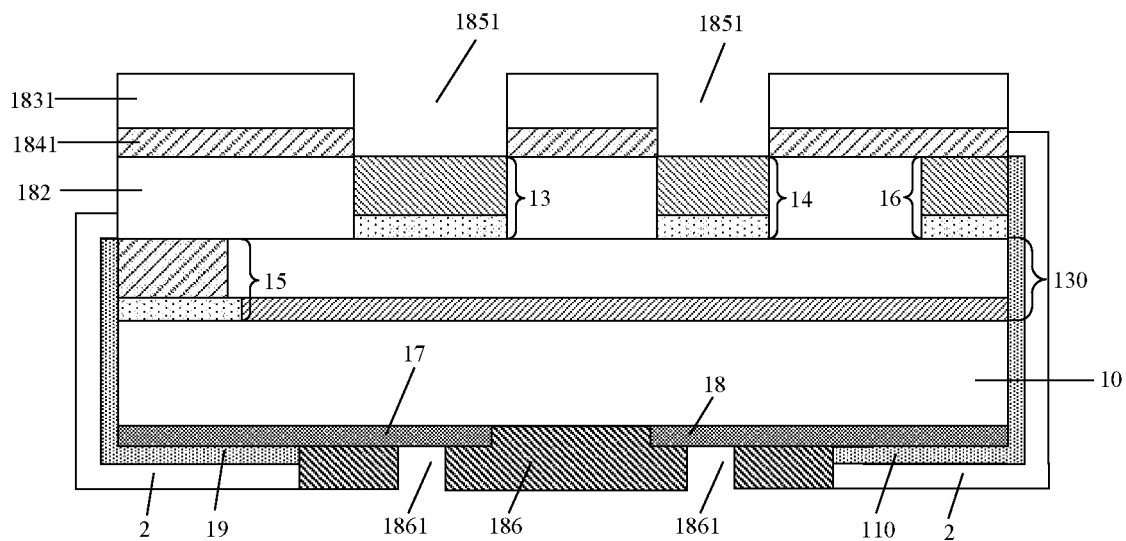
FIG. 10B is a sectional view showing a structure of yet another driving backplane for display, in accordance with some embodiments.

In some examples, as shown in FIG. 10B, the method of manufacturing the driving backplane 1 for display further includes: forming an insulating protection layer 186 on sides of the first bonding electrodes 17 and the second bonding electrodes 18 away from the base 10. The insulating protection layer 186 is provided with through holes 1861 that expose portions of the first bonding electrodes 17 and the second bonding electrodes 18. The insulating protection layer 186 is used for preventing oxygen, moisture and nitrogen in the environment from affecting the first bonding electrodes 17 and the second bonding electrodes 18.

For example, a material of the insulating protection layer 186 includes SiN.

For example, the insulating protection layer 186 may be formed through a magnetron sputtering process.

Figure 11:
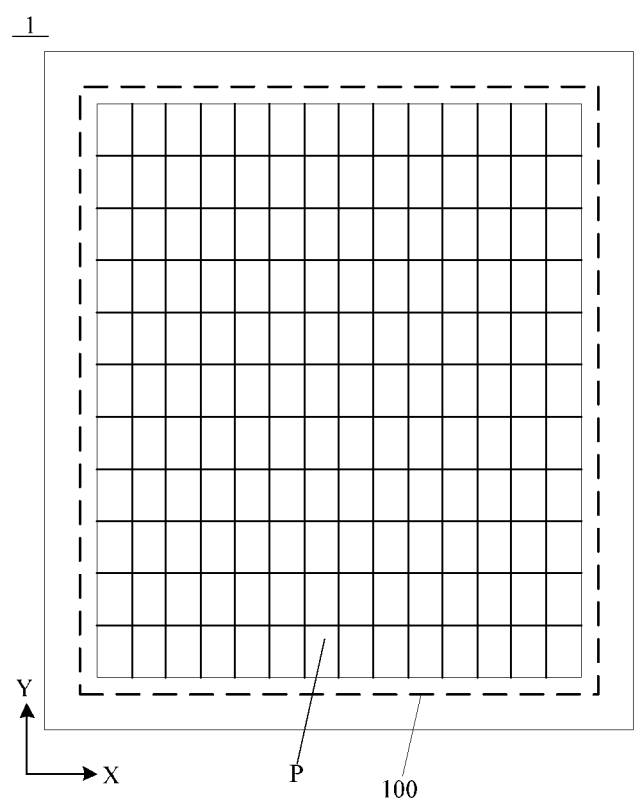
FIG. 11 is a distribution diagram of sub-pixel regions of a driving backplane for display, in accordance with some embodiments.

In some embodiments, as shown in FIG. 11, the driving backplane 1 for display has a display region 100 including a plurality of sub-pixel regions P. The plurality of sub-pixel regions P may be arranged in different manners (e.g., a manner of rows and columns or other manners) according to actual needs. As shown in FIG. 11, the plurality of sub-pixel regions P are arranged in a plurality of columns in a first direction X and a plurality of rows in a second direction Y.

As shown in FIGS. 2, 9A and 12A to 12E, at least one electrode group is disposed in a sub-pixel region P. For example, in the plurality of sub-pixel regions P, each sub-pixel region P is provided with one electrode group. For another example, in the plurality of sub-pixel regions P, each sub-pixel region P is provided with electrode groups. For yet another example, in the plurality of sub-pixel regions P, a certain sub-pixel region P or each sub-pixel region P of some sub-pixel regions P is provided with one electrode group, and each sub-pixel region P of remaining sub-pixel regions P is provided with electrode groups.

The plurality of first conductive lines 15 extend in a row direction (i.e., the first direction X) of the plurality of sub-pixel regions P, and the plurality of second conductive lines 16 extend in a column direction (i.e., the second direction Y) of the plurality of sub-pixel regions P. All first electrodes 13 in a row of sub-pixel regions P are electrically connected to at least one first conductive line 15, and all second electrodes 14 in a column of sub-pixel regions P are electrically connected to at least one second conductive line 16.

In some examples, as shown in FIGS. 2, 9A, and 12A to 12E, all first electrodes 13 in the row of sub-pixel regions P are electrically connected to at least two first conductive lines 15, and different first conductive lines 15 are connected to different first electrodes 13; and all second electrodes 14 in the column of sub-pixel regions P are electrically connected to at least one second conductive line 16. For example, all first electrodes 13 in each row of sub-pixel regions P are electrically connected to at least two first conductive lines 15, and different first conductive lines 15 are connected to different first electrodes 13; and all second electrodes 14 in each column of sub-pixel regions P are electrically connected to at least one second conductive line 16.

In some examples, at least one sub-pixel region P is provided with two electrode groups, which are a first electrode group and a second electrode group. For example, each sub-pixel region P of the plurality of sub-pixel regions P is provided with two electrode groups. For another example, a certain sub-pixel region P of the plurality of sub-pixel regions P or each sub-pixel region P of some sub-pixel regions P of the plurality of sub-pixel regions P is provided with two electrode groups, and each sub-pixel region P of remaining sub-pixel regions P is provided with one electrode group.

Figure 12A:
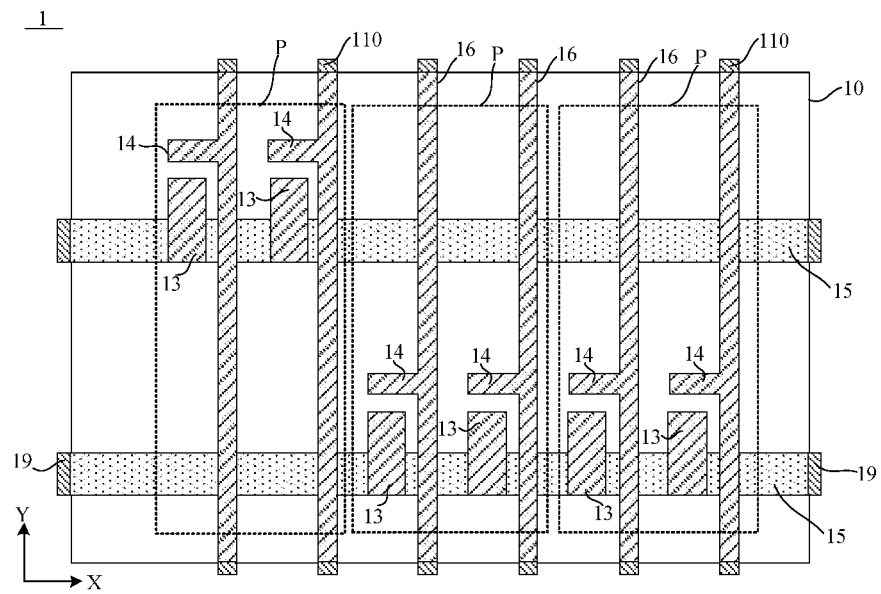
FIG. 12A is a top view showing a structure of yet another driving backplane for display, in accordance with some embodiments.

For example, as shown in FIG. 12A, in the sub-pixel region P provided with two electrode groups, the first electrode 13 in the first electrode group and the first electrode 13 in the second electrode group are electrically connected to the same first conductive line 15, the second electrode 14 in the first electrode group is electrically connected to a second conductive line 16, and the second electrode 14 in the second electrode group is electrically connected to another second conductive line 16. That is, the first electrodes 13 in the two electrode groups are electrically connected to the same first conductive line 15, and the second electrodes 14 in the two electrode groups are electrically connected to different second conductive lines 16.

Figure 12B:
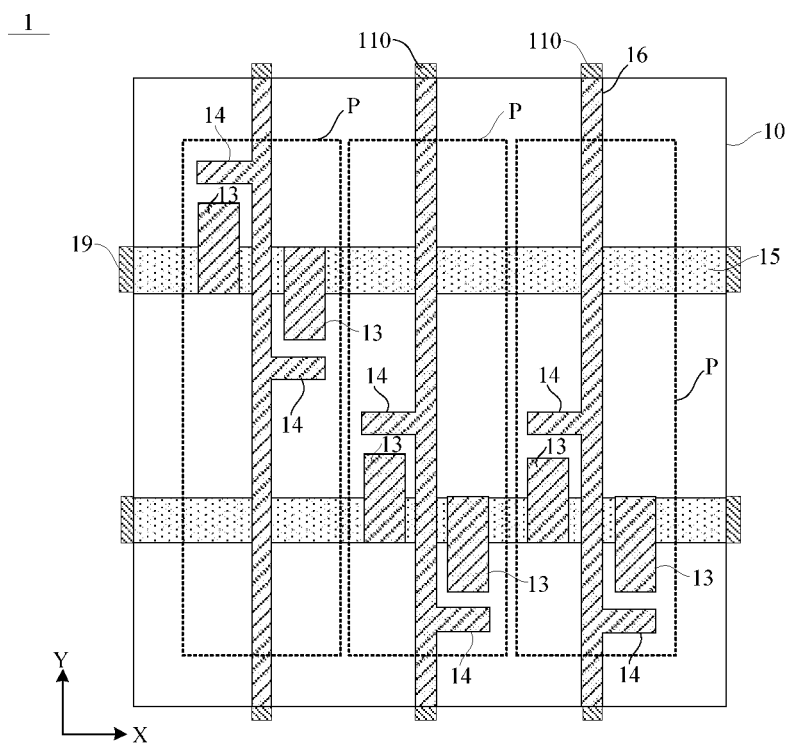
FIG. 12B is a top view showing a structure of yet another driving backplane for display, in accordance with some embodiments.
Figure 12C:
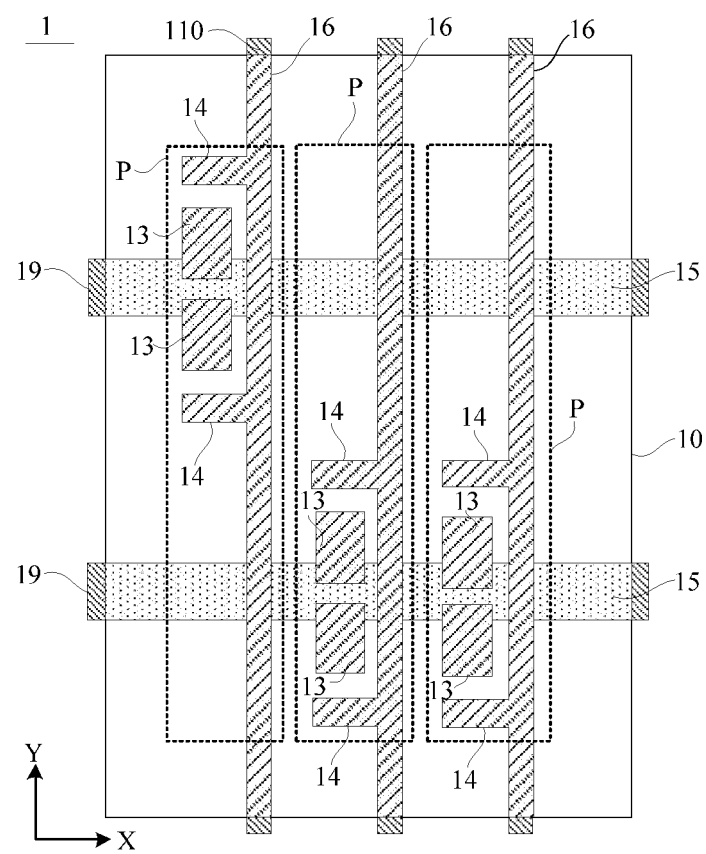
FIG. 12C is a top view showing a structure of yet another driving backplane for display, in accordance with some embodiments.
Figure 12D:
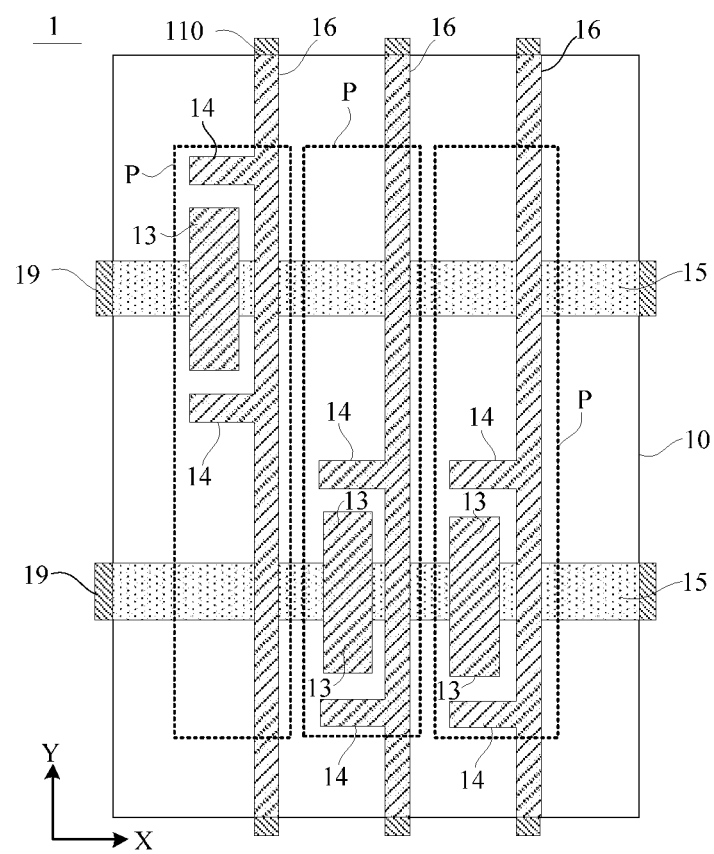
FIG. 12D is a top view showing a structure of yet another driving backplane for display, in accordance with some embodiments.

For another example, as shown in FIGS. 12B, 12C, and 12D, in the sub-pixel region P provided with two electrode groups, the first electrode 13 in the first electrode group and the first electrode 13 in the second electrode group are electrically connected to the same first conductive line 15, and the second electrode 14 in the first electrode group and the second electrode 14 in the second electrode group are electrically connected to the same second conductive line 16. That is, the first electrodes 13 in the two electrode groups are electrically connected to the same first conductive line 15, and the second electrodes 14 in the two electrode groups are electrically connected to the same second conductive line 16. In FIG. 12C, the first electrodes 13 in the two electrode groups are independent of each other. In FIG. 12D, the first electrodes 13 in the two electrode groups are shared.

Figure 12E:
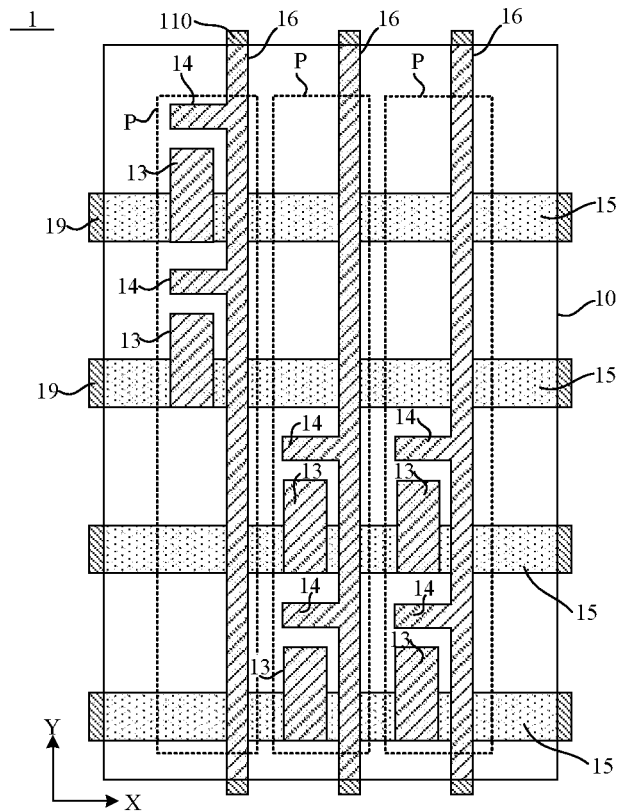
FIG. 12E is a top view showing a structure of yet another driving backplane for display, in accordance with some embodiments.

For another example, as shown in FIG. 12E, in the sub-pixel region P provided with two electrode groups, the first electrode 13 in the first electrode group is electrically connected to a first conductive line 15, and the first electrode 13 in the second electrode group is electrically connected to another first conductive line 15. The second electrode 14 in the first electrode group and the second electrode 14 in the second electrode group are electrically connected to the same second conductive line 16. That is, the first electrodes 13 in the two electrode groups are electrically connected to two different first conductive lines 15, and the two second electrodes 14 in the two electrode groups are electrically connected to the same second conductive line 16.

In the sub-pixel region P provided with two electrode groups, one of the two electrode groups drives the light-emitting device to display normally, and the other electrode group serves as a spare electrode group. That is, in a case where one of the electrode groups is bonded to the light-emitting device, if the light-emitting device fails to work normally, the spare electrode group is bonded to another light-emitting device, so that the first electrode 13 and the second electrode 14 in the spare electrode group drives the another light-emitting device to emit light.

In a process of manufacturing the display panel using the driving backplane 1 for display, for the sub-pixel region P provided with two electrode groups, when bonding the light-emitting device, the light-emitting device is bonded to the first electrode 13 and the second electrode 14 in one of the two electrode groups first. For example, the light-emitting device is bonded to the first electrode group first. The display panel is tested after the first electrode groups in all sub-pixel regions P are each bonded to one light-emitting device, each of all sub-pixel regions P being provided with two electrode groups. If a light-emitting device in a certain sub-pixel region P fails to work normally, another light-emitting device is bonded to the second electrode group in the certain sub-pixel region P, the first electrode 13 in the first electrode group that is unable to drive the light-emitting device to emit light is disconnected from the first conductive line 15 and/or the second electrode 14 in the first electrode group that is unable to drive the light-emitting device to emit light is disconnected from the second conductive line 16. For example, the first electrode 13 and/or the second electrode 14 may be cut off through a laser process.

Figure 13:
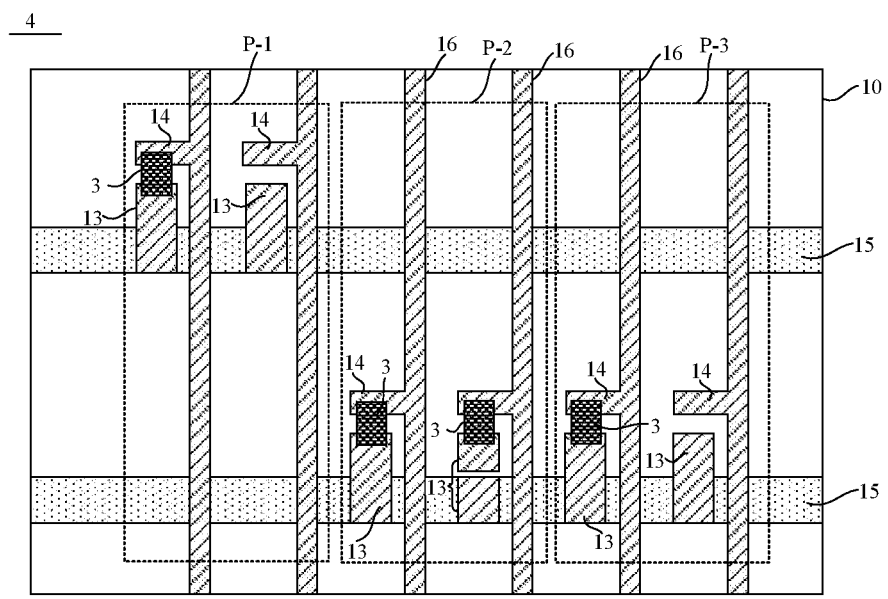
FIG. 13 is a top view showing a structure of a display panel, in accordance with some embodiments.

For example, as shown in FIG. 13, if the second electrode group in the second sub-pixel region P-2 needs to be bonded to another light-emitting device 3, the first electrode 13 in the first electrode group in the second sub-pixel region P-2 may be cut off, so that the first electrode 13 is disconnected from the first conductive line 15; as a result, the light-emitting device 3 bonded to the first electrode group is unable to be driven to emit light.

It will be noted that, in a case where the first electrode 13 is disconnected from the first conductive line 15 and/or the second electrode 14 is disconnected from the second conductive line 16, it is possible to only cut off the first electrode 13 and/or the second electrode 14, so as to avoid damaging the structures of the first conductive line 15 and the second conductive line 16.

In the display panel having the driving backplane 1 for display in some embodiments of the present disclosure, when the light-emitting device 3 in the sub-pixel region that is unable to normally emit light is maintained, there is no need to remove the light-emitting device 3 that is previously bonded, and the another light-emitting device may be directly bonded to the spare electrode group; as a result, a maintenance process is simplified, a maintenance efficiency is high, and a maintenance success rate is high.

Based on this, dimensions of the first conductive line 15 and dimensions of the second conductive line 16 may be determined according to actual application needs.

In some embodiments, a width of the first conductive line 15 in a direction perpendicular to the direction in which the first conductive line 15 extends is greater than a width of the second conductive line 16 in a direction perpendicular to the direction in which the second conductive line 16 extends. In this way, since a conductive line with a large width may provide a stable current output, the current on the first conductive line 15 is large; therefore, in a case where the first conductive line 15 is electrically connected to the positive electrode of the light-emitting device 3, it is possible to satisfy a working current requirement of the positive electrode of the light-emitting device 3. In addition, it is convenient to distinguish between the first conductive line 15 and the second conductive line 16 when the light-emitting device 3 is bonded, so as to distinguish between the first electrode 13 and the second electrode 14.

In some examples, thicknesses of the first conductive line 15 and the second conductive line 16 are the same.

Some embodiments of the present disclosure provide a driving backplane 1 for display manufactured through the above method. As shown in FIG. 2, the driving backplane 1 for display includes a base 10, a first conductive pattern layer 11 disposed on the base 10, and a second conductive pattern layer 12 disposed on a side of the first conductive pattern layer 11 away from the base 10. The first conductive pattern layer 12 includes a plurality of first conductive lines 15. The second conductive pattern layer 12 includes a plurality of electrode groups and a plurality of second conductive lines 16, and the plurality of first conductive lines 15 and the plurality of second conductive lines 16 cross and are insulated from each other. An electrode group of the plurality of electrode groups includes a first electrode 13 and a second electrode 14, and the second electrode 14 is electrically connected to a corresponding second conductive line 16. Orthogonal projections, on the base 10, of the first electrode 13 and a corresponding first conductive line 15 have an overlapping region, and a portion of the first electrode 13, whose orthogonal projection on the base 10 is located in the overlapping region, is in contact with a portion of the first conductive line 15, whose orthogonal projection on the base 10 is located in the overlapping region.

As shown in FIG. 13, some embodiments of the present disclosure provide a display panel 4. The display panel 4 includes the driving backplane 1 for display. As shown in FIG. 11, the driving backplane 1 for display has a plurality of sub-pixel regions P. As shown in FIG. 13, the display panel 4 further includes a plurality of light-emitting devices 3, and the plurality of light-emitting devices 3 are disposed in the plurality of sub-pixel regions P. Only one light-emitting device 3 in each sub-pixel region P is configured to emit light, and each light-emitting device 3 that is configured to emit light is electrically connected to the first electrode 13 and the second electrode 14 in the same electrode group disposed in the sub-pixel region P.

In some examples, the plurality of sub-pixel regions P include first sub-pixel regions, second sub-pixel regions and third sub-pixel regions. Each light-emitting device 3 disposed in the first sub-pixel region is configured to emit light of a first color, each light-emitting device 3 disposed in the second sub-pixel region is configured to emit light of a second color, and each light-emitting device 3 disposed in the third sub-pixel region is configured to emit light of a third color. The light of the first color, the light of the second color and the light of the third color are three primary colors (e.g., red, green and blue).

In some examples, the light-emitting device 3 located in the first sub-pixel region P-1 emits red light, the light-emitting device 3 located in the second sub-pixel region P-2 emits green light, and the light-emitting device 3 located in a third sub-pixel region P-3 emits blue light. Since a current property of the light-emitting device 3 emitting red light is different from current properties of the light-emitting device 3 emitting green light and the light-emitting device 3 emitting blue light (the light-emitting device 3 emitting red light requires a larger current), a magnitude of an electrical signal provided by the first conductive line 15 for the light-emitting device 3 emitting red light is different from magnitude(s) of electrical signal(s) provided by first conductive line(s) 15 for the light-emitting device emitting green light and the light-emitting device emitting blue light. Based on this, in some examples, at least two first conductive lines 15 are arranged in each sub-pixel region P, one first conductive line 15 of the at least two first conductive lines 15 provides an electrical signal to the light-emitting device 3 emitting red light, and another first conductive line 15 of the at least two first conductive lines 15 provides another electrical signal to the light-emitting device emitting green light and the light-emitting device emitting blue light.

In some embodiments, a positive electrode of the light-emitting device 3 is electrically connected to the first electrode 13, and a negative electrode of the to light-emitting device 3 is electrically connected to the second electrode 14.

The display panel 4 has the same beneficial effects as the method of manufacturing the driving backplane 1 for display as described above, and details will not be repeated here.

It will be noted that, in a case where two electrode groups are provided in the sub-pixel region P, one or two light-emitting devices 3 may be provided in the sub-pixel region P. For the sub-pixel region P provided with two light-emitting devices 3, only one light-emitting device 3 is configured to emit light, and the light-emitting device 3 is electrically connected to the first electrode 13 and the second electrode 14 in the electrode group corresponding thereto.

For example, in the sub-pixel region P provided with two electrode groups, if the sub-pixel region P is provided with only one light-emitting device 3, one of the two electrode groups is connected to the light-emitting device 3, and the first electrode 13 and the second electrode 14 in the electrode group drive the light-emitting device 3 to emit light; and if the sub-pixel region P is provided with two light-emitting devices 3, although each light-emitting device 3 is connected to the first electrode 13 and the second electrode 14 in the corresponding electrode group, only one of the two electrode groups is able to drive the corresponding light-emitting device 3 to emit light normally, and the first electrode 13 and the second electrode 14 in the other electrode group is unable to drive the corresponding light-emitting device 3 to emit light. That is, in the sub-pixel region P, the first electrode 13 and the second electrode 14 in the electrode group that is able to drive the corresponding light-emitting device 3 to emit light normally are electrically connected to the light-emitting device 3, and the first electrode 13 and the second electrode 14 in the other electrode group are not electrically connected to the corresponding light-emitting device 3. Here, the phrase "electrically connected" means that electrical signals may be transmitted from the first electrode 13 and the second electrode 14 to the light-emitting device 3, so as to drive the light-emitting device 3 to emit light. The electrical signal on the first electrode 13 is received from the first conductive line 15, and the electrical signal on the second electrode 14 is received from the second conductive line 16. Therefore, when an open circuit occurs between at least one of the first electrode 13 and the second electrode 14 in the other electrode group and the first conductive line 15 and/or the second conductive line 16, the light-emitting device 3 corresponding to the other electrode group cannot be driven to emit light.

For example, as shown in FIG. 13, each of the first sub-pixel region P-1 and the third sub-pixel region P-3 is provided with one light-emitting device 3, and each light-emitting device 3 is electrically connected to one electrode group in the sub-pixel region P where the light-emitting device 3 is located.

The second sub-pixel region P-2 is provided with two light-emitting devices 3, one of the two light-emitting devices 3 is electrically connected to the first electrode 13 and the second electrode 14 in one electrode group and is able to emit light normally; and the first electrode 13 in another electrode group connected to the other light-emitting device 3 is cut off, so that the first electrode 13 is disconnected from the first conductive line 15, and an electrical signal cannot be transmitted from the first conductive line 15 to the first electrode 13. Therefore, the other light-emitting device 13 is unable to emit light.

It will be noted that, in the second sub-pixel region P-2, only the first electrode 13 being cut off is taken as an example, of course, only the second electrode 14 may be cut off, or the first electrode 13 and the second electrode 14 are cut off.

It will be understood that, in each sub-pixel region P provided with light-emitting to device(s) 3, the number of light-emitting device(s) 3 in the sub-pixel region P is less than or equal to the number of electrode group(s) in the sub-pixel region P. For example, in a case where there is one light-emitting device 3 in the sub-pixel region P, there may be two or more electrode groups in the sub-pixel region P, but only one of the electrode groups is electrically connected to the light-emitting device 3, and remaining electrode groups are not electrically connected to the light-emitting device 3.

In some examples, the light-emitting device 3 is a Mini LED or a Micro LED.

In some examples, the light-emitting devices 3 are installed on the driving backplane 1 for display through a bonding process.

The display panel 4 has the same beneficial effects as the driving backplane 1 for display, and details will not be repeated here.

Figure 14A:
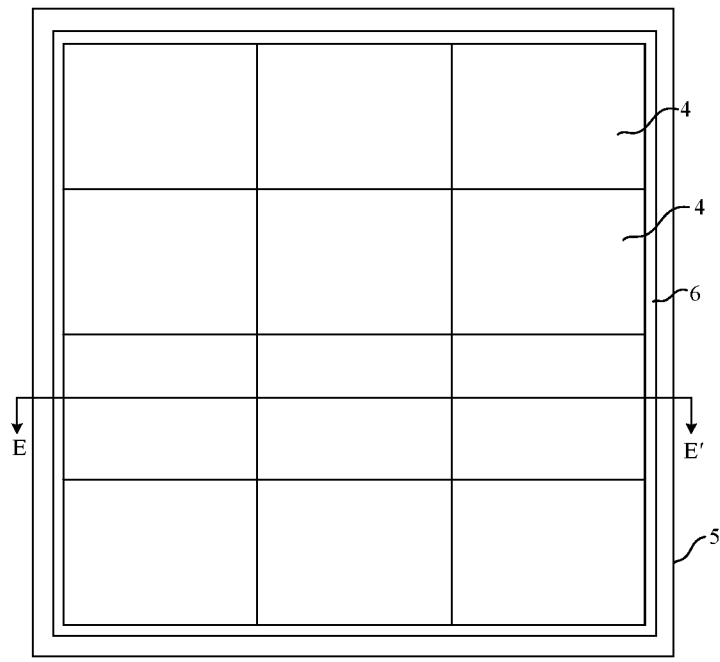
FIG. 14A is a top view showing a structure of a display apparatus, in accordance with some embodiments.
Figure 14B:
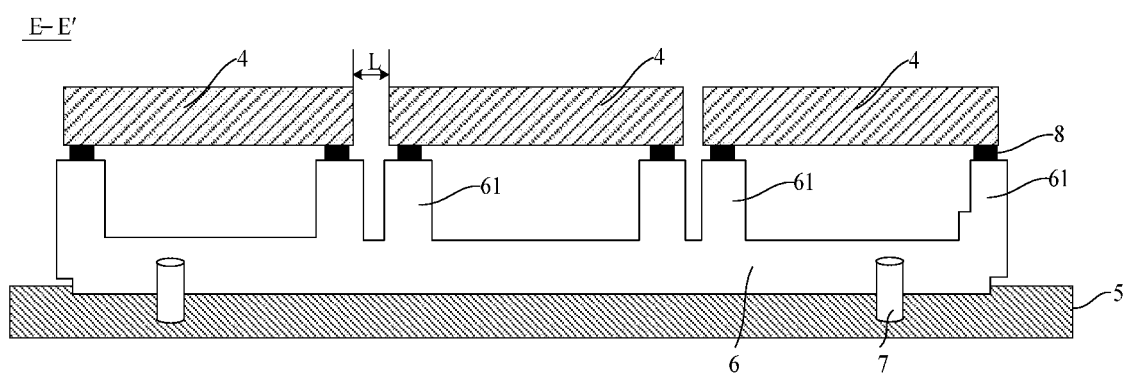
FIG. 14B is a sectional view showing a structure of the display apparatus in FIG. 14A taken along the direction E-E'.

Some embodiments of the present disclosure provide a display apparatus. As shown in FIGS. 14A and 14B, the display apparatus includes a display screen, and the display screen includes a plurality of display panels 4 as described above.

As shown in FIG. 14A, the plurality of display panels 4 are tiled to form a large-sized display screen. In some examples, as shown in FIG. 14B, the display apparatus further includes a truss 5 and a housing 6, the truss 5 and the housing 6 are fixedly connected through locking components 7, and the housing 6 is provided with a plurality of magnetic pillars 61. When the display panels 4 is installed, a plurality of magnets 8 are fixed on a back face of the display panels 4. The number of the magnets 8 is equal to the number of the magnetic pillars 61, and the magnets 8 are in one-to-one correspondence with the magnetic pillars 61; and thus the display panels 4 and the housing 6 are attracted and fixed through magnetic forces between the magnetic pillars 61 and the magnets 8, thereby achieving the tiling of the plurality of display panels 4. For example, a distance L between two adjacent display panels 4 is in a range of 0.9 pitch to 1.2 pitch, where 1 pitch is equal to a distance between two pins of the light-emitting device 3. Since the distance between two adjacent display panels 4 is small, and the frame of the display panel 4 is narrow, gaps between the display panels 4 in the display screen formed by tiling the plurality of display panels 4 may be small, so that the tiling effect is good.

The plurality of display panels 4 are tiled to form the large-sized display screen, so that the display apparatus may be applied to large-size display and has a wide application range.

The foregoing descriptions are merely specific implementation manners of the present disclosure, but the protection scope of the present disclosure is not limited thereto. Any person skilled in the art could conceive of changes or replacements within the technical scope of the present disclosure, which shall be included in the protection scope of the present disclosure. Therefore, the protection scope of the present disclosure shall be subject to the protection scope of the claims.

What is claimed is:

1. A method of manufacturing a driving backplane for display, comprising:
    forming a first conductive pattern layer on a base, the first conductive pattern layer including a plurality of first conductive lines; and
    forming a second conductive pattern layer on a side of the first conductive pattern layer away from the base, wherein the second conductive pattern layer includes a plurality of electrode groups and a plurality of second conductive lines; the plurality of first conductive lines and the plurality of second conductive lines cross and are insulated from each other; an electrode group of the plurality of electrode groups includes a first electrode and a second electrode, and the second electrode is electrically connected to a corresponding second conductive line; and orthogonal projections, on the base, of the first electrode and a corresponding first conductive line have an overlapping region, and a portion of the first electrode, whose orthogonal projection on the base is located in the overlapping region, is in contact with a portion of the first conductive line, whose orthogonal projection on the base is located in the overlapping region.

2. The method according to claim 1, wherein forming the first conductive pattern layer on the base includes:
    forming a first seed film on the base;
    patterning the first seed film to obtain a seed pattern layer including a plurality of first conductive sub-lines;
    forming a first insulating layer on the base on which the seed pattern layer has been formed, wherein the first insulating layer includes a plurality of first hollow-out portions, and an orthogonal projection, on the base, of each first hollow-out portion is located within an orthogonal projection, on the base, of a corresponding first conductive sub-line; and
    forming a first electroplated metal layer on a surface of the seed pattern layer away from the base and in the plurality of first hollow-out portions, wherein the first electroplated metal layer includes a plurality of second conductive sub-lines, and a second conductive sub-line and a first conductive sub-line in contact therewith constitute the first conductive line.

3. The method according to claim 2, wherein forming the first insulating layer on the base on which the seed pattern layer has been formed includes:
    forming a first insulating sub-film on the base on which the seed pattern layer has been formed, a material of the first insulating sub-film including an inorganic material;

forming a second insulating sub-film on a surface of the first insulating sub-film away from the base, a material of the second insulating sub-film including an organic material; and patterning the second insulating sub-film and the first insulating sub-film to obtain the first insulating layer.

4. The method according to claim 2, wherein forming the second conductive pattern layer on the side of the first conductive pattern layer away from the base includes:

forming a second seed film on the base on which the first electroplated metal layer has been formed;

forming a second insulating layer on a surface of the second seed film away from the base, wherein the second insulating layer includes a plurality of second hollow-out portions, a plurality of third hollow-out portions and a plurality of fourth hollow-out portions; the plurality of second hollow-out portions are located in regions where a plurality of first electrodes are to be formed, the plurality of third hollow-out portions are located in regions where a plurality of second electrodes are to be formed, and the plurality of fourth hollow-out portions are located in regions where the plurality of second conductive lines are to be formed;

forming a second electroplated metal layer on the surface of the second seed film away from the base and in the plurality of the second hollow-out portions, the plurality of third hollow-out portions and the plurality of fourth hollow-out portions; and removing the second insulating layer and portions of the second seed film that overlap with the second insulating layer, so that the second electroplated metal layer and remaining portions of the second seed film form the plurality of first electrodes in regions where portions of the second electroplated metal layer formed in the plurality of second hollow-out portions are located, the plurality of second electrodes in regions where portions of the second electroplated metal layer formed in the plurality of third hollow-out portions are located, and the plurality of second conductive lines in regions where portions of the second electroplated metal layer formed in the plurality of fourth hollow-out portions are located.

5. The method according to claim 4, before the second seed film is formed, the method further comprising:

forming a first planarization layer on the base on which the first electroplated metal layer has been formed, wherein the first planarization layer includes a plurality of fifth hollow-out portions, and an orthogonal projection, on the base, of each fifth hollow-out portion overlaps with an orthogonal projection, on the base, of a second hollow-out portion.

6. The method according to claim 5, wherein forming the second seed film on the base on which the first electroplated metal layer has been formed includes: forming the second seed film on the base on which the first planarization layer has been formed.

7. The method according to claim 1, further comprising:

forming a second planarization layer, a passivation layer and a third planarization layer sequentially on the base on which the second conductive pattern layer has been formed;

forming a metal film on a side of the base away from the third planarization layer;

patterning the metal film to form a plurality of first bonding electrodes and a plurality of second bonding electrodes;

forming a plurality of first connection lines and a plurality of second connection lines on side faces of the base, wherein each first connection line extends to positions of a corresponding first conductive line and a corresponding first bonding electrode from a side face of the base, and is electrically connected to the first conductive line and the first bonding electrode; and each second connection line extends to positions of a corresponding second conductive line and a corresponding second bonding electrode from a side face of the base, and is electrically connected to the second conductive line and the second bonding electrode; and patterning at least the passivation layer and the third planarization layer to expose the first electrode and the second electrode.

8. The method according to claim 7, wherein the second conductive pattern layer further includes a plurality of connection electrodes; and an edge portion of the first conductive line in a length direction thereof is electrically connected to a connection electrode, and the first connection line extends from a side face of the first conductive line to a side face of the connection electrode that is electrically connected to the first conductive line.

9. The method according to claim 7, further comprising: forming a protective layer at least on the side faces of the base on which the plurality of first connection lines and the plurality of second connection lines have been formed, the protective layer covering the plurality of first connection lines and the plurality of second connection lines.

10. The method according to claim 7, wherein forming the plurality of first connection lines and the plurality of second connection lines on the side faces of the base includes: forming the plurality of first connection lines and the plurality of second connection lines on the side faces of the base through any one of a pad printing, a three-dimension (3D) printing, a patterning process or a laser cutting.

11. The method according to claim 1, wherein the driving backplane for display has a plurality of sub-pixel regions, and at least one electrode group is disposed in a sub-pixel region;

the plurality of first conductive lines extend in a row direction of the plurality of sub-pixel regions, and the plurality of second conductive lines extend in a column direction of the plurality of sub-pixel regions;

all first electrodes in a row of sub-pixel regions are electrically connected to at least two first conductive lines, and different first conductive lines are electrically connected to different first electrodes; and all second electrodes in a column of sub-pixel regions are electrically connected to at least one second conductive line.

12. The method according to claim 11, wherein at least one sub-pixel region is provided with two electrode groups, and the two electrode groups are a first electrode group and a second electrode group.

13. The method according to claim 12, wherein a first electrode in the first electrode group and a first electrode in the second electrode group are electrically connected to a same first conductive line; and a second electrode in the first electrode group and a second electrode in the second electrode group are electrically connected to a same second conductive line.

14. The method according to claim 12, wherein a first electrode in the first electrode group and a first electrode in the second electrode group are electrically connected to a same first conductive line; and
- a second electrode in the first electrode group and a second electrode in the second electrode group are electrically connected to two different second conductive lines.

15. The method according to claim 12, wherein a first electrode in the first electrode group and a first electrode in the second electrode group are electrically connected to two different first conductive lines; and
- a second electrode in the first electrode group and a second electrode in the second electrode group are electrically connected to a same second conductive line.

16. The method according to claim 1, wherein a width of the first conductive line in a direction perpendicular to a direction in which the first conductive line extends is greater than a width of the second conductive line in a direction perpendicular to a direction in which the second conductive line extends.

17. A driving backplane for display, the driving backplane for display being manufactured through the method according to claim 1; the driving backplane for display comprising:
- the base;
- the first conductive pattern layer disposed on the base, wherein the first conductive pattern layer includes the plurality of first conductive lines; and
- the second conductive pattern layer disposed on the side of the first conductive pattern layer away from the base, wherein the second conductive pattern layer includes the plurality of electrode groups and the plurality of second conductive lines; the plurality of first conductive lines and the plurality of second conductive lines cross and are insulated from each other; the electrode group of the plurality of electrode groups includes the first electrode and the second electrode, and the second electrode is electrically connected to the corresponding second conductive line; the orthogonal projections, on the base, of the first electrode and the corresponding first conductive line have the overlapping region, and the portion of the first electrode, whose orthogonal projection on the base is located in the overlapping region, is in contact with the portion of the first conductive line, whose orthogonal projection on the base is located in the overlapping region.

18. A display panel, comprising the driving backplane for display according to claim 17 and a plurality of light-emitting devices, wherein the driving backplane for display has a plurality of sub-pixel regions, and the plurality of light-emitting devices are disposed in the plurality of sub-pixel regions, wherein
- one light-emitting device in each sub-pixel region is configured to emit light; and each light-emitting device that is configured to emit light is electrically connected to the first electrode and the second electrode in a same electrode group disposed in the sub-pixel region.

19. The display panel according to claim 18, wherein a positive electrode and a negative electrode of the light-emitting device that is configured to emit light are electrically connected to the first electrode and the second electrode in the electrode group.

20. A display apparatus, comprising a display screen, the display screen being tiled by a plurality of display panels according to claim 18.

* * * * *